United States Patent
Kitahara et al.

(10) Patent No.: US 8,083,328 B2
(45) Date of Patent: Dec. 27, 2011

(54) ELECTROSTATIC ACTUATOR, DROPLET DISCHARGING HEAD, METHOD OF MANUFACTURING THEREOF AND DROPLET DISCHARGING DEVICE

(75) Inventors: Koji Kitahara, Ina (JP); Motoki Itoda, Suwa (JP); Masahiro Fujii, Shiojiri (JP); Yoshifumi Hano, Suwa (JP)

(73) Assignee: Seiko Epson Corporation (JP)

( * ) Notice: Subject to any disclaimer, the term of this patent is extended or adjusted under 35 U.S.C. 154(b) by 1025 days.

(21) Appl. No.: 11/970,186

(22) Filed: Jan. 7, 2008

(65) Prior Publication Data

US 2008/0165225 A1    Jul. 10, 2008

(30) Foreign Application Priority Data

Jan. 9, 2007 (JP) ................. 2007-000983

(51) Int. Cl.
*B41J 2/045* (2006.01)
(52) U.S. Cl. ........... 347/71; 347/70; 347/68; 347/55; 347/64
(58) Field of Classification Search ......... 347/70–72, 347/63, 64, 55, 68
See application file for complete search history.

(56) References Cited

U.S. PATENT DOCUMENTS

2006/0125879 A1*  6/2006  Fujii et al. ............. 347/54

FOREIGN PATENT DOCUMENTS

| JP | 08-118626 | 5/1996 |
|----|-----------|--------|
| JP | 10-296973 | 11/1998 |
| JP | 2000-318155 | 11/2000 |
| JP | 2002-046282 | 2/2002 |
| JP | 2003-080708 | 3/2003 |
| JP | 2006-108251 | 4/2006 |
| JP | 2006-198820 | 8/2006 |
| JP | 2006-263933 | 10/2006 |
| JP | 2006-271183 | 10/2006 |
| JP | 2006-278818 | 10/2006 |
| JP | 2006-304379 | 11/2006 |
| JP | 2007-069478 | 3/2007 |

* cited by examiner

*Primary Examiner* — Matthew Luu
*Assistant Examiner* — Henok Legesse
(74) *Attorney, Agent, or Firm* — Harness, Dickey & Pierce, P.L.C.

(57) ABSTRACT

An electrostatic actuator comprises: a fixed electrode formed on a substrate; a movable electrode placed at an position opposing the fixed electrode via a predetermined gap; a driving unit giving the movable electrode a displacement by generating an electrostatic force between the fixed electrode and the movable electrode: and an insulation film made of $Hf_x Al_y O_z$ formed on an opposing surface of at least one of the fixed electrode and the movable electrode.

6 Claims, 25 Drawing Sheets

ELECTROSTATIC ACTUATOR, DROPLET DISCHARGING HEAD, METHOD OF MANUFACTURING THEREOF AND DROPLET DISCHARGING DEVICE

BACKGROUND

1. Technical Field

The present invention relates to an electrostatic actuator used for an inkjet head driven by an electrostatic force, a droplet discharging head, a method of manufacturing thereof and a droplet-discharging device.

2. Related Art

As a droplet discharging head, an inkjet head driven by an electrostatic force is known and facilitated for an inkjet recording device. An inkjet head driven by an electrostatic force generally comprises an electrostatic actuator including an individual electrode (a fixed electrode) formed on a glass substrate and an oscillating plate (a movable plate) made of silicon and placed at a position opposing the individual electrode via a predetermined gap. The ink jet head further comprises a nozzle substrate in which a plurality of nozzle holes are formed for discharging ink droplets, a discharging chamber communicated with the nozzle holes by being coupled to the nozzle substrate, a cavity substrate in which an ink flow channel such as a reservoir is formed, applying a pressure to a discharging chamber by generating an electrostatic force in the electrostatic actuator and discharging ink droplets from selected nozzle holes.

The conventional electrostatic actuator includes an insulating film on an opposing surface of the oscillating plate or the individual electrode in order to secure driving stability and endurance by avoiding dielectric break down or electric short cut of an insulating film in the actuator. Such insulating film is generally made of thermally oxidized silicon. The reason for using thermally oxidized silicon is simplicity in a manufacturing process and superior insulating characteristics. Further, JP-A-2000-318155 discloses an electrostatic actuator in which an oxidized silicon film and nitride film are used. JP-A-8-118626 and JP-A-2003-80708 further disclose an electrostatic actuator in which an insulating film is formed on both the oscillating plate and the individual plate. JP-A-2002-46282 further discloses an electrostatic actuator in which a double layered (a high volume resistance layer and a low volume resistance layer) protection film is formed only on a surface of the individual electrode. JP-A-2006-271183 further discloses an electrostatic actuator in which an insulating film made of a dielectric material, of which relative permittivity is higher than that of oxide silicon such as a high-k material (a gate insulating film having high relative permittivity) is formed to improve a generation pressure of the actuator.

The above conventional technologies, however, have a problem of limitation in which thermal silicon oxide film as an insulating film for an electrode of an electrostatic actuator is applied to only a silicon substrate. Hence, the thermal silicon oxide film is formed only on a side of oscillation plate, which is a movable electrode. On the other hand, as shown in JP-A-8-118626, when a $SiO_2$ film is used, many carbon additives are mixed in the film during a manufacturing process such as a CVD method. The mixture results in instability of the film such as wear of the film due to repeated contact with an individual electrode through an endurance examination.

JP-A-8-118626 shows that a thermal silicon oxide film is formed on the side of the oscillating plate and an oxide silicon film (a sputtered film) is formed on the individual electrode by sputtering. But, the dielectric breakdown voltage of the sputtered film is so low that the thickness of it should be thicker or another film having a high dielectric breakdown voltage such as thermal oxide film should be formed on the side of the oscillating plate in order to avoid insulation break down of an electrostatic actuator.

Further, JP-A-2003-80708 shows that both the oscillating plate and the individual electrode are made of silicon, thermal oxide films are formed as an insulation film on them and an insulating film is not formed on a contact surface to the silicon substrate. A silicon substrate, however, is more expensive than a glass substrate, resulting in high manufacturing cost.

JP-A-2002-46282 shows a double-layered film for a protecting electrode composed of high volume resistance layer and low volume resistance layer only on the individual electrode and the oscillating plate is made of a metal such as molybdenum, tungsten, and nickel. Such insulation structure, however, results in complex structures in an electrostatic actuator, complex manufacturing processes, becoming high cost.

JP-A-2006-271183 shows that a insulating material of which permitivity is higher than that of oxide silicon is used as a insulating film of an actuator, which is shown in the formula (2) described later, enhancing a generation pressure of an actuator. Driving an actuator requires application of a voltage to a space between electrodes. However, such applied voltage is limited to be low if the dielectric breakdown voltage of an insulation film on an electrode is low. Such limitation results in difficulty in improving the above generation pressure of an actuator in case when the dielectric breakdown voltage of a high-K material is lower than that of oxide silicon since the applied voltage V should be small based on the formula (2).

Further, the above all patent documents do not disclose that an insulation film is formed by an atomic layer deposition (ALD) method.

On the other hand, in recent years, the demand of high density with high resolution and high driving speed in an electrostatic driving ink jet head provided with a electrostatic actuator is sharply increased, making an electrostatic actuator further miniaturized. In order to response such demand, a further improved insulating structure of an electrostatic actuator is a key factor, enhancing the generation pressure of an electrostatic actuator with a low cost, stability of driving it and driving endurance.

SUMMARY

An advantage of the present invention is to provide an electrostatic actuator to solve the above-mentioned issues. In particular, it provides an inkjet head driven by electrostatic force, a droplet discharging head, a method of manufacturing thereof and droplet discharging apparatus, which meets the demand of high density with high resolution and high driving speed.

As a first aspect of the invention, an electrostatic actuator comprises a fixed electrode formed on a substrate, a movable electrode placed at an position opposing the fixed electrode via a predetermined gap, a driving unit giving the movable electrode a displacement by generating an electrostatic force between the fixed electrode and the movable electrode and an insulation film made of $Hf_xAl_yO_z$ formed on an opposing surface of at least one of the fixed electrode and the movable electrode.

According to the first aspect of the invention, the insulation film made of $Hf_xAl_yO_z$ is formed at least on an opposing surface of one of the fixed electrode and the movable electrode by the ALD method. The $Hf_xAl_yO_z$ film realizes the higher permittivity compared to that of oxide silicon that is compatible with a dielectric breakdown voltage, which is necessary for an electrostatic actuator, improving the generation pressure of an electrostatic actuator and realizing downsizing of an electrostatic actuator and high density of it.

In the electrostatic actuator of the first aspect of the invention, the relationship between x and y in a insulating film made of $Hf_xAl_yO_z$ satisfies the following formula 1.

$$x \geqq y \qquad \text{formula 1}$$

For example, the ratio of x to y can be changeable such as 2:1, 5:1 more than or including 1:1, depending on an object for using the $Hf_xAl_yO_z$ film regarding its permittibity.

In the electrostatic actuator of the first aspect of the invention, a $SiO_2$ insulating film may be formed on at least one of the fixed electrode and the movable electrode. This structure can further improve a dielectric breakdown voltage.

Further, in the electrostatic actuator of the first aspect of the invention, a surface protecting film made of a carbon material such as diamond or diamond like carbon may be formed on the insulating film.

The surface protecting film made of a carbon material such as diamond or diamond like carbon is a hard film having high surface smoothness and low frictional property, improving stability of driving an electrostatic actuator and its driving endurance.

Further, in the electrostatic actuator of the first aspect of the invention, the insulating film under the surface protecting film may be made of $SiO_2$.

The surface protecting film made of a carbon material such as diamond or diamond like carbon shows high adhesion with the $SiO_2$ film and doesn't flake from it, improving stability of driving an electrostatic actuator and its driving endurance.

A second aspect of the invention is a method of manufacturing an electrostatic actuator having a fixed electrode formed on a substrate, a movable electrode placed at a position opposing the fixed electrode via a predetermined gap, and a driving unit giving the movable electrode a displacement by generating an electrostatic force between the fixed electrode and the movable electrode.

The method includes; forming the fixed electrode on a glass substrate: forming an insulating film made of $Hf_xAl_yO_z$ by an atomic layer deposition (ALD) method on an entire surface of a silicon substrate bonded to the glass substrate: bonding the glass substrate to the silicon substrate with anodization; thinning the silicon substrate on the bonded substrate to be a thin plate; forming the movable electrode by etching a surface of the silicon substrate, which opposes the bonded surface of the silicon substrate on the bonded substrate.

According to the second aspect of the invention, the method forms the $Hf_xAl_yO_z$ film on the entire surface of the silicon substrate at the bonded side by an ALD method. This ALD method forms a film with atomic level, which has extremely high stability and realizes a thin thickness with high precision. This method realizes both the improvement of the generation pressure of an actuator and securing the dielectric breakdown voltage.

A third aspect of the invention is a method of manufacturing an electrostatic actuator having a fixed electrode formed on a substrate, a movable electrode placed at a position opposing the fixed electrode via a predetermined gap, and a driving unit giving the movable electrode a displacement by generating an electrostatic force between the fixed electrode and the movable electrode.

The method includes; forming the fixed electrode on a glass substrate: forming an insulating film made of $Hf_xAl_yO_z$ by an atomic layer deposition (ALD) method on the fixed electrode; bonding the glass substrate to the silicon substrate with anodization; thinning the silicon substrate on the bonded substrate to be a thin plate; forming the movable electrode by etching a surface of the silicon substrate, which opposes the bonded surface of the silicon substrate on the bonded substrate.

According to the third aspect of the invention, the method forms the $Hf_xAl_yO_z$ film on the fixed electrode on the glass substrate by the ALD method. As mentioned the above, this ALD method realizes both the improvement of the generation pressure of an actuator and securing the dielectric breakdown voltage and is able to manufacture an electrostatic actuator with being downsized and having a high density.

A fourth aspect of the invention is a method of manufacturing an electrostatic actuator having a fixed electrode formed on a substrate, a movable electrode placed at a position opposing the fixed electrode via a predetermined gap, and a driving unit giving the movable electrode a displacement by generating an electrostatic force between the fixed electrode and the movable electrode.

The method includes: forming the fixed electrode on a glass substrate; forming an $SiO_2$ film on the fixed electrode; forming an insulating film made of $Hf_xAl_yO_z$ by an atomic layer deposition (ALD) method on an entire surface of a silicon substrate bonded to the glass substrate; bonding the glass substrate to the silicon substrate with anodization; thinning the silicon substrate on the bonded substrate to be a thin plate; forming the movable electrode by etching a surface of the silicon substrate, which opposes the bonded surface of the silicon substrate on the bonded substrate.

According to the fourth aspect of the invention, the method forms $SiO_2$ film on the fixed electrode and the $Hf_xAl_yO_z$ film on the entire bonded surface of the silicon substrate. This ALD method realizes superiority in a dielectric breakdown voltage and bonding strength. Further, it is able to manufacture an electrostatic actuator with being downsized and having a high density and a high generation pressure.

A fifth aspect of the invention is a method of manufacturing an electrostatic actuator having a fixed electrode formed on a substrate, a movable electrode placed at a position opposing the fixed electrode via a predetermined gap, and a driving unit giving the movable electrode a displacement by generating an electrostatic force between the fixed electrode and the movable electrode.

The method includes: forming the fixed electrode on a glass substrate; forming an insulating film made of $Hf_xAl_yO_z$ by an atomic layer deposition (ALD) method on the fixed electrode; forming an $SiO_2$ film on the entire surface of the silicon substrate bonded to the glass substrate; bonding the glass substrate to the silicon substrate with anodization; thinning the silicon substrate to be a thin plate; forming the movable electrode by etching a surface of the silicon substrate, which opposes the bonded surface of the silicon substrate.

According to the fifth aspect of the invention, the method forms $SiO_2$ film on the entire bonded surface of the silicon substrate and the $Hf_xAl_yO_z$ film on the fixed electrode on the glass substrate. This ALD method realizes a superior dielectric breakdown voltage and bonding strength. Further, it is able to manufacture an electrostatic actuator with being downsized and having a high density and a high generation pressure.

Further, according to the above second to fifth aspects of the invention, another $SiO_2$ film may be deposited on the insulating film made of $Hf_xAl_yO_z$.

This additional process can further improve a dielectric breakdown voltage.

Further, a surface protection film made of carbon material such as diamond or diamond like carbon is formed on the insulating film, more preferably on the $SiO_2$ film.

This additional process can further improve stability of actuator's driving and the driving durability. Here, using diamond like carbon as a surface protection film is more preferable since it shows desirable adhesiveness with the lower insulating film, high surface smoothness and low friction The compound used as a surface protection film shows extremely high film stress against the lower insulating film in general. This feature requires thin thickness of the surface protection film as much as possible in order to avoid flaking of the interface of the surface protection film from the lower insulating film.

Further, the surface protection film may be removed at the bonding area of the glass substrate or the silicon substrate since it is difficult to sufficiently bond the surface protection film with anodization.

As a sixth aspect of the invention, a droplet discharging head comprises: a nozzle substrate having a single or a plurality of nozzle holes discharging droplets; a cavity substrate having a concave portion as a discharging chamber connected to each of nozzle holes formed at the side of the nozzle substrate; an electrode substrate having a fixed individual electrode placed at a position opposing an oscillating plate as a movable electrode formed in the bottom of the discharging chamber via a predetermined gap and the actuator according to the above aspects of the invention.

The droplet discharging head of the sixth aspect of the invention includes an electrostatic actuator showing superior driving stability and durability and high actuator generation pressure, resulting in high reliable and superior droplet discharging features and high density.

As a seventh aspect of the invention, a method of manufacturing a droplet discharging head comprises: forming a nozzle substrate having a single or a plurality of nozzle holes discharging droplets; forming a cavity substrate having a concave portion as a discharging chamber connected to each of nozzle holes formed at the side of the nozzle substrate; forming an electrode substrate having a fixed individual electrode placed at a position opposing an oscillating plate as a movable electrode formed in the bottom of the discharging chamber via a predetermined gap and forming the actuator according to the above aspects of the invention.

This method can manufacture a droplet discharging head with high reliability and superior droplet discharging feature.

Further, the droplet discharging device of the invention is provided with the above mentioned droplet discharging head, realizing an inkjet printer with high resolution, high density and high speed.

BRIEF DESCRIPTION OF THE DRAWING

The invention will be described with reference to the accompanying drawings, wherein like numbers reference like elements.

DESCRIPTION OF EXEMPLARY EMBODIMENTS

Figure 1:
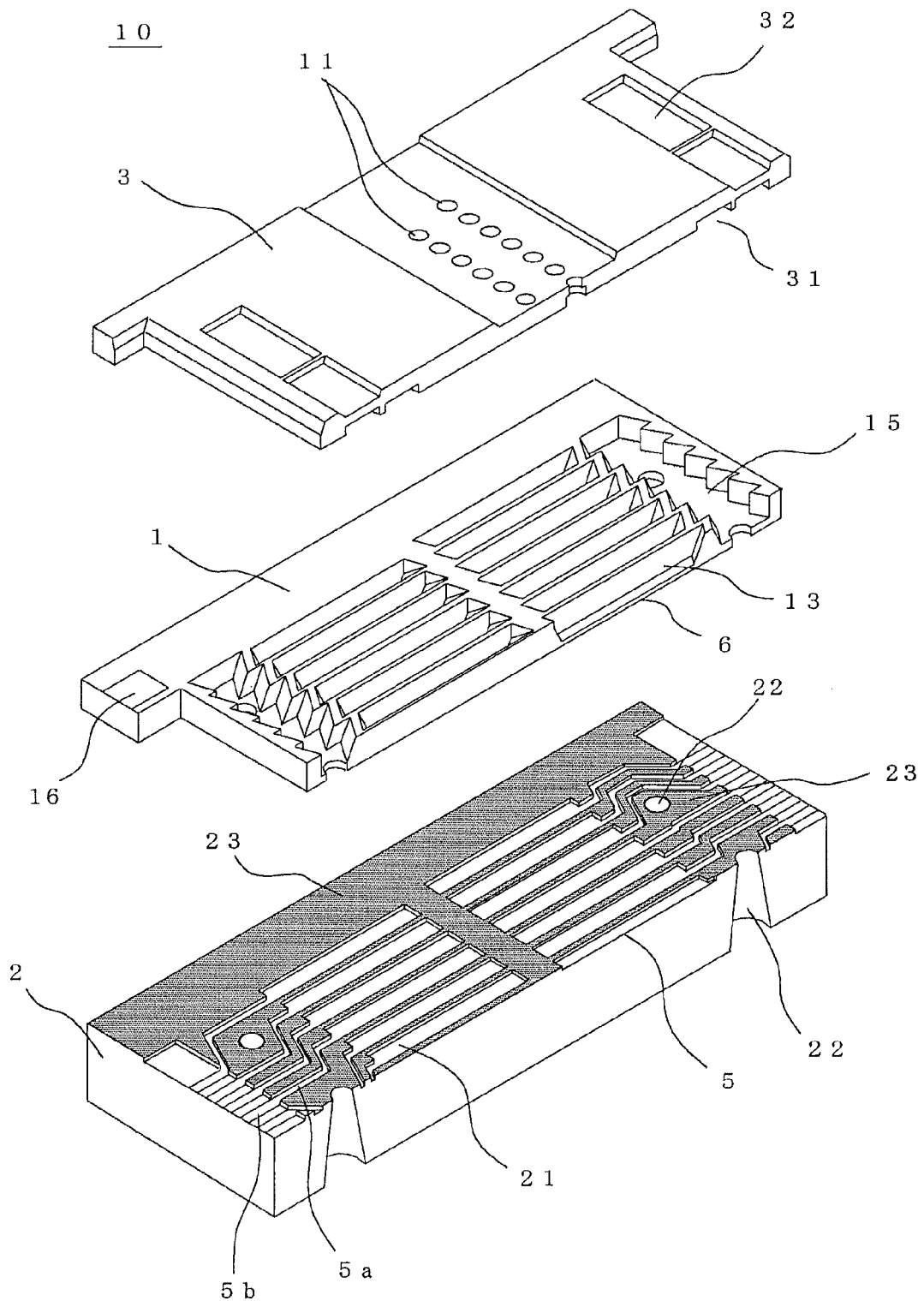
FIG. 1 is a perspective exploded view showing an inkjet head according to a first embodiment of the invention.
Figure 2:
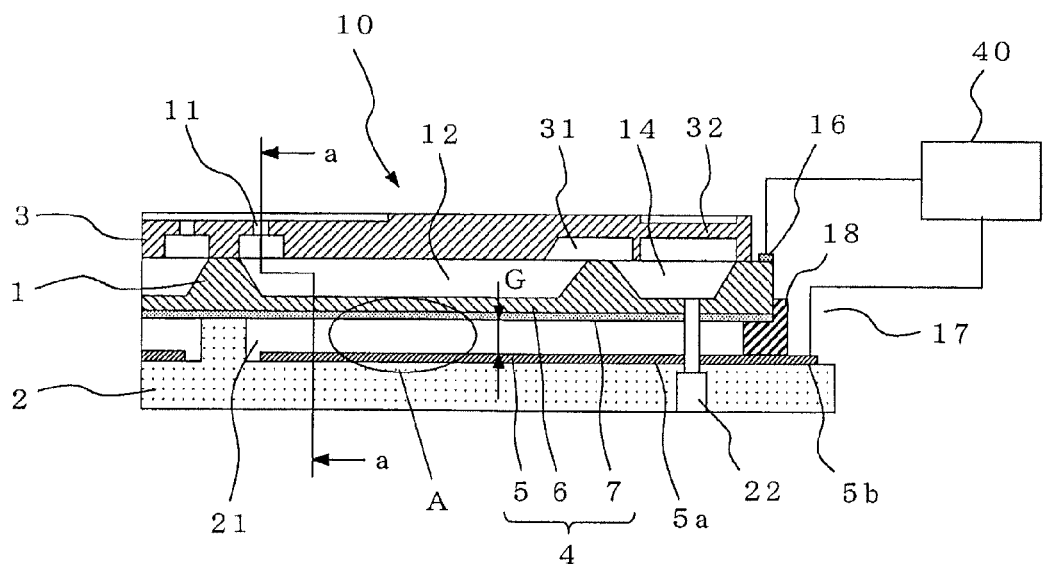
FIG. 2 is a sectional view showing right side area of an assembled inkjet head in FIG. 1.
Figure 3:
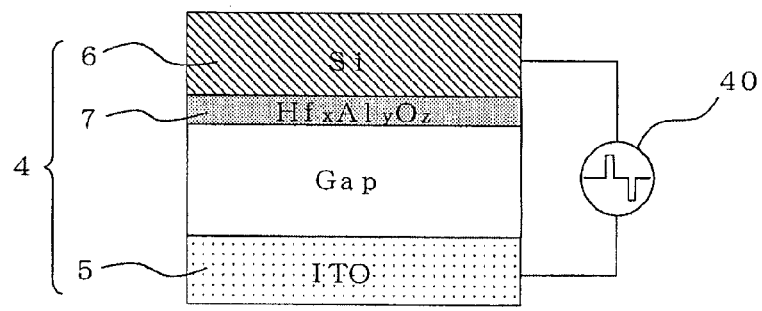
FIG. 3 is a sectional view enlarged from A area in FIG. 2
Figure 4:
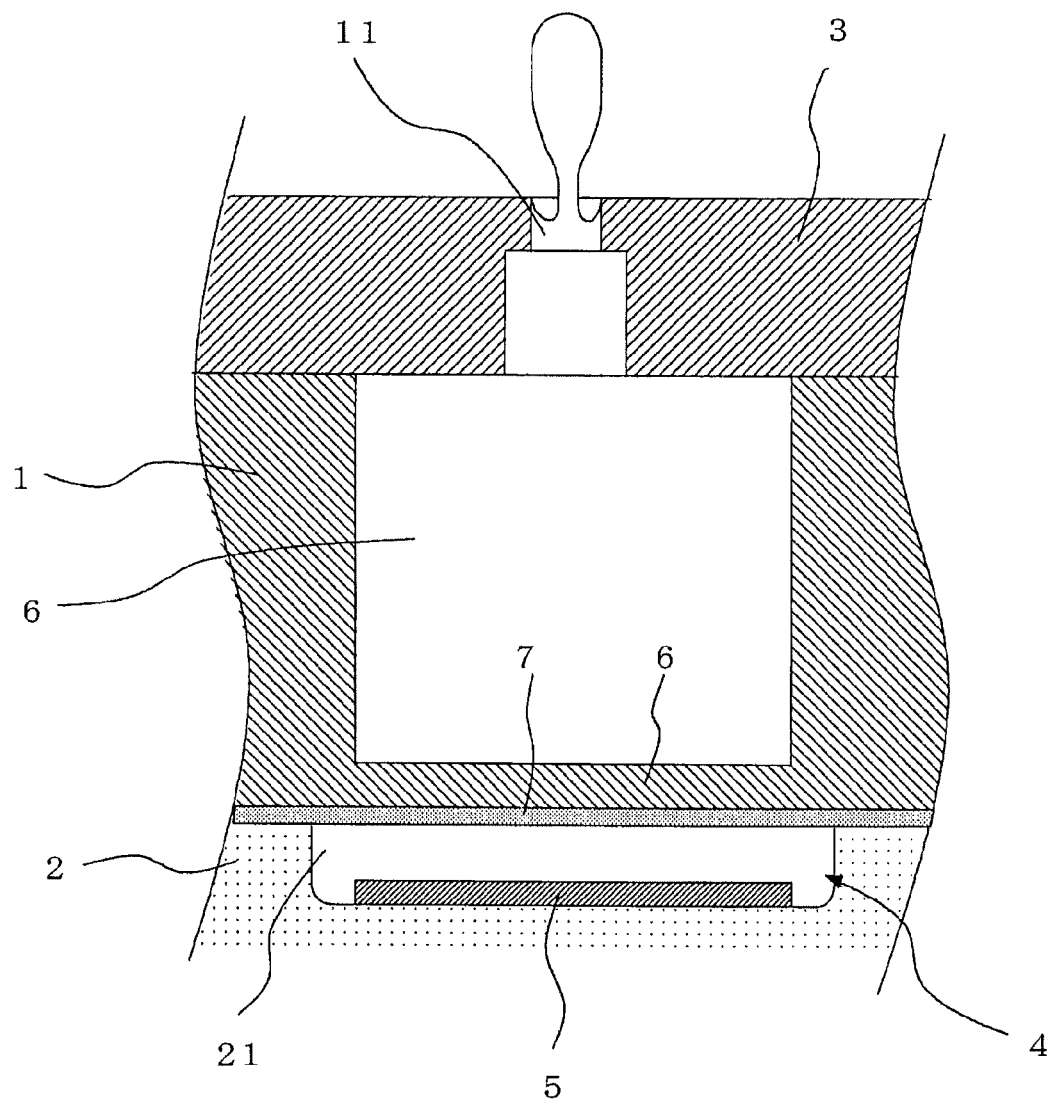
FIG. 4 is a sectional view enlarged from a-a line in FIG. 2

Embodiments regarding a droplet discharging ink jet head provided with an electrostatic actuator of the invention will now be described with reference to accompanying drawings. As an example of a droplet discharging head, a face discharging type inkjet head driven by an electrostatic force is explained accompanying with FIG. 1 to FIG. 5. This head discharges ink droplets from a nozzle installed on the surface of a nozzle substrate. Here, the present invention is not limited to the structure and configuration shown in the following figures. The invention can also be applied to a four-layered structure in which each of four substrates has a discharging chamber and a reservoir and an edge discharging type droplet discharging head, which discharges ink droplets from nozzle holes installed in the edge of a substrate.

First Embodiment

An inkjet head 10 of the embodiment comprises a multi-stacked structure in which three substrates 1, 2 and 3 are attached together as described hereafter and shown in FIG. 1 to FIG. 5. The inkjet head 10 includes nozzle holes 11 which are arranged as two columns. Namely it has two head portions on left and right sides every nozzle holes column. But such head portion may be a single. A numbers of nozzle holes 11 are not limited.

A first substrate 1 intermediately placed is called as a cavity substrate and made of single crystalline silicon having a plane orientation (110). The surface of it has grooves or concave portions formed by etching to be a plurality of flow channel. Each of flow channels includes a concave portion 13 for a discharging chamber 13 in which the bottom portion is an oscillating plate 6. The oscillating plate 6 includes a movable electrode and a boron-diffused layer having desired thickness. Further, it has a reservoir portion 14 and a concave portion 15 communicated to each of flow channels. In the above structure of four stacked substrates, the reservoir is formed as the fourth substrate on the other silicon substrate (called as a reservoir substrate.)

A second substrate 2 bonded to the lower surface of the first substrate 1 is called as an electrode substrate or an electrode glass substrate and made of glass. The second substrate 2 is bonded to the first substrate with anodization and generally made of boric silicate glass of which thermal expansion coefficient is close to that of silicon in order to secure bonding strength without flaking.

An individual electrode 5 generally made of Indium Tin Oxide (ITO) is formed as a fixed electrode on the surface of the second substrate 2. The individual electrode 5 is deposited within the concave portion 21 at a position opposing the oscillating plate 6 by etching. The oscillating plate 6 and the individual electrode 5 are oppositely placed each other with a predetermined interval (a gap length) G.

Further, an insulating film 7 is interposed between the oscillating plate 6 and the individual electrode 5 and described later in order to avoid insulation break down or short circuit. This interposition makes the substantial effective gap length G be the distance between the insulating film 7 and the individual electrode 5. This gap length G is designed to be 110 nm. An electrostatic actuator unit 4 is provided with the oscillating plate 6 having the insulation film 7 and the individual electrode 5.

The electrostatic actuator of the embodiment includes the $Hf_xAl_yO_z$ film as the insulating film 7 formed on one opposing surface of the individual electrode 5 or the oscillating plate 6. The film is formed by an atomic layer deposition (ALD) method. Here, x and y satisfy the relationship $x \geq y$.

The ALD method can form a film with atomic level, of which film property is extremely dense. Further, it can grow a film of which thickness is extremely uniform and ultra thin. Further, the ratio of x to y can be changeable such as 2:1, 5:1 more than or including 1:1, varying permittivity of the $Hf_xAl_yO_z$ film.

The embodiment changes a time ratio of supplying TEMAH (Tetrakis(N-ethyl methyl amino) halfnium) as a material gas for Hf, $O_3$ gas, and TMA (trimethyl aluminum) as a material gas for Al, varying the ratio of x to y.

The premittivty of the $Hf_xAl_yO_z$ film is 11 to 15, which is extremely higher than that of $SiO_2$ (the permittivty: about 9) and $Al_2O_3$ (the permittivity: about 7.8.) The thickness of the $Hf_xAl_yO_z$ film is not particularly limited, but 60 nm in the embodiment and the following. This thickness is appropriately determined with taking consideration of the dielectric breakdown voltage of the $Hf_xAl_yO_z$ film and generation pressure of an electrostatic actuator. The thickness of the ITO film in the individual electrode 5 is 100 nm.

The second substrate 2 includes a single or a plurality of ink supply holes 22. Each of the ink supply holes 22 is installed at a bonded portion 23, which is island like area blacked out as shown in FIG. 1 and penetrates through the bottom portion to communicate with the reservoir 14. The ink supply holes 22 are connected to an ink tank not shown in the figure.

A released end portion of a gap formed between the oscillating plate 6 and the individual electrode 5 and air-tightly sealed by a sealing member 18 such as an epoxy resin. This sealing prevents humidity and dusts from getting through a gap between electrodes, keeping high reliably of the ink jet head 10.

The third substrate 3 bonded to the upper surface of the first substrate 1 is called as a nozzle substrate and made of single crystalline silicon. The substrate 3 comprises nozzle holes 11, which is formed by etching to communicate the discharging chamber 12 and vertically penetrates through the third substrate 3, a supply inlet 31 formed like a groove toward the lower surface to make the discharging chamber 12 communicate with the reservoir 14 and a diaphragm 32 compensating pressure variations in the reservoir 14. Nozzle holes 11 comprises two stages such as an injection region having a small diameter and an introduction region having a large diameter, improving the ability of going straight by ink droplets. Here, in a case of the above structure of four stacked substrates, the reservoir comprises not only the reservoir but communicating holes to make nozzle holes 11 communicate with the discharging chamber 12 and holes to make the reservoir communicate with the discharging chamber. The bottom portion of the reservoir may be a diaphragm.

Figure 5:
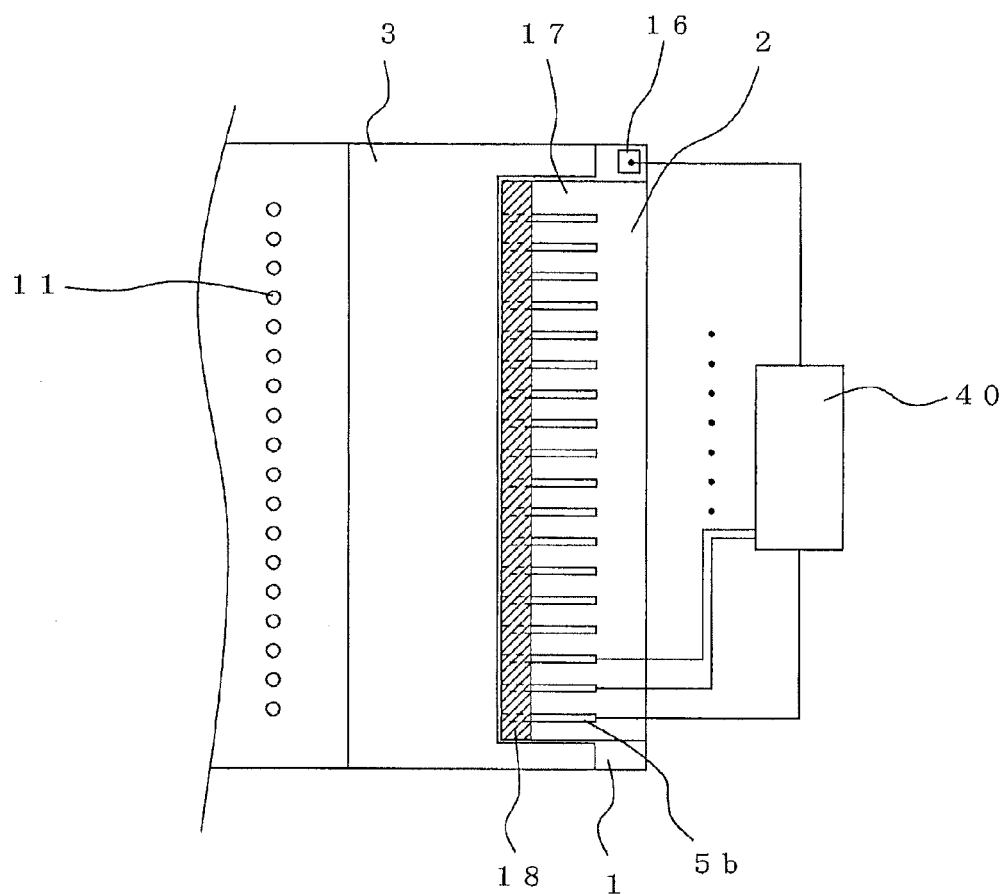
FIG. 5 is a upper plain view of the inkjet head in FIG. 2

The back end portion of the first substrate 1 and the third substrate 3 is an electrode pullout portion 17, which is opened by etching as shown in FIG. 1 and FIG. 5 and has a reversed C square shape seeing from a plain view. The individual electrode 5 formed on the second electrode 2 comprises a lead portion 5a and an end portion 5b, which is configured to be exposed at the electrode pullout portion 17. Further, a common electrode 16 is formed at one side or both sides of an end portion of the upper surface of the first substrate 1 As a driving means for an electrostatic actuator, a driving control circuit 40 such as a driver IC for applying pulse voltages to a spacing between the oscillating electrode 6 and the individual electrode is mounted in FPC (sot shown). This FPC is connected to an end portion 5b and to a common electrode 16 of the individual electrode 5.

Next, an operation of the inkjet head 10 is explained thereafter. When the driving control circuit 40 applies pulse voltages to the spacing between the individual electrode 5 and the common electrode 16, the oscillating plate 6 is pulled toward the individual electrode and bent, generating negative pressure within the discharging chamber 12, absorbing ink within the reservoir and generating ink oscillation (meniscus oscillation.) At the time when this ink oscillation becomes almost a maximum point, the voltage is removed, releasing the oscillating plate, pushing ink from the nozzle holes 11 by the plate's restorative force and discharging ink droplets into a recording paper (not shown.)

Here, generation pressure of an electrostatic actuator is explained.

An electrostatic pressure (generation pressure) P absorbing and pulling the oscillating plate when driving, is expressed as the following formula; namely the value obtained by differentiating electrostatic energy and dividing it with an area of the oscillating plate, where x is an appropriate position of the oscillation plate 6 against that of the individual electrode 5, electrostatic energy: E, an area of the oscillation plate 6: S, an applied voltage: V, an thickness of the insulating film 7: t, vacuum permittivity: $\epsilon_0$ relative permittivity of the insulating film 7: $\epsilon_r$.

$$P(x) = \frac{1}{S}\frac{\partial E(x)}{\partial x} = -\frac{\varepsilon_0}{2}\frac{V^2}{\left(\frac{t}{\varepsilon_r}+x\right)^2} \quad [\text{Formula 1}]$$

Further, average pressure $P_e$ of the gap length, namely the operation length of the oscillating plate 6 is a pressure shown in the following formula 2 obtained by integrating the formula 1 with the gap length d.

$$P_e = \frac{1}{d}\int_0^d P(x) = \frac{\varepsilon_0 \varepsilon_r}{2}\frac{V^2}{t\left(\frac{t}{\varepsilon_r}+d\right)} \quad [\text{Formula 2}]$$

The above formula 2 shows that the average pressure $P_e$ becomes large when the relative permittivity of the insulating film becomes large. Hence, using a high-k material of which permittivity is higher than that of oxide silicon as the insulating film enhances the generation pressure of the electrostatic actuator.

Further, the inkjet head 10 provided with a high -k material as the insulating film can obtain a necessary power for discharging ink droplets even when the area of the insulating plate 6 becomes small. Therefore, when the width of the oscillating plate 6 in the ink jet head 10 becomes small and a pitch of the discharging room 21, namely a pit of the nozzles 11 becomes small, resolution can be improved, realizing the inkjet head 10 which can attain high speed printing with high precision. Further, shortening the length of the oscillating plate 6 improves response capability of ink flow channels and increases driving frequency, realizing further high speed printing.

Further doubling the relative permittivity of the insulating film 7 can attain the same generation pressure even when the thickness of the insulating film 7 is doubled. This doubling can make the strength of the dielectric break down of the electrostatic actuator, such as time depend dielectric break down (TDDB), time zero dielectric break down (TZDB) almost doubled.

The electrostatic actuator of the embodiment 1 shows following technical advantages since the insulating film 7 made of $Hf_xAl_yO_z$ is formed by the ADL method on the surface of the oscillating plate 6 opposing the individual electrode 5.

(1) Improving Discharging Capability is Compatible with Securing Dielectric Breakdown Voltage.

The $Hf_xAl_yO_z$ film increases relative permittivity comparing with that of a $SiO_2$ insulating film, enhancing the generation pressure of an electrostatic actuator. The following is the experimental result of comparing one case of forming multi layer $Hf_2$ and $Al_2O_3$ with the other case of forming $Hf_xAl_yO_z$ film. The case of forming multilayer Hf $O_2$ and $Al_2$ $O_3$ of which each thickness is 30 nm and totally 60 nm is compared with the other case of forming $Hf_xAl_yO_z$ film which thickness is 60 nm. The values of relative permittivity show the almost same. But, the dielectric breakdown voltage of the case when Hf $O_2$ and $Al_2$ $O_3$ are deposited with each 30 nm thickness is 6 MV/cm. The dielectric breakdown voltage of the $Hf_xAl_yO_z$ film is 8 MV/cm. Namely, Improving discharging capability is compatible with securing dielectric breakdown voltage without being constrained from a low applied voltage. As a result, it is possible to improve discharging capability of an ink jet head when this electrostatic actuator is applied to an ink jet head.

(2) Securing Strength of Bonding

The $Hf_xAl_yO_z$ film has the relatively high strength of bonding, securing the strength of bonding comparing to the conventional electrostatic actuator.

(3) Simple Manufacturing Process

A manufacturing process is simple since $Hf_xAl_yO_z$ is deposited on only an entire surface of the silicon substrate. Further, comparing with forming the $Hf_xAl_yO_z$ film on the individual electrode 5, removing the $Hf_xAl_yO_z$ film is not necessary, making a manufacturing process simple.

Second Embodiment

Figure 6:
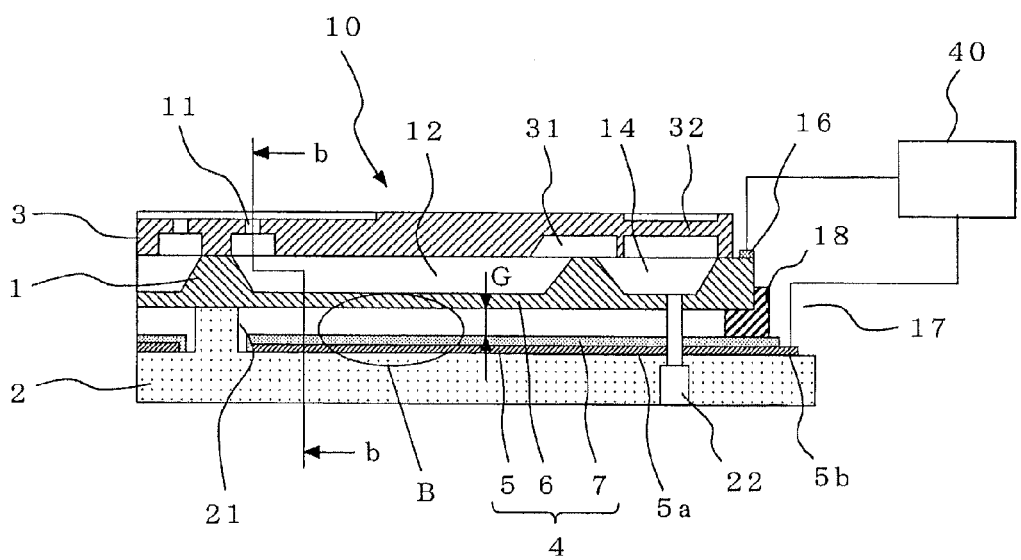
FIG. 6 is a perspective sectional view showing an inkjet head according to a second embodiment of the invention.
Figure 7:
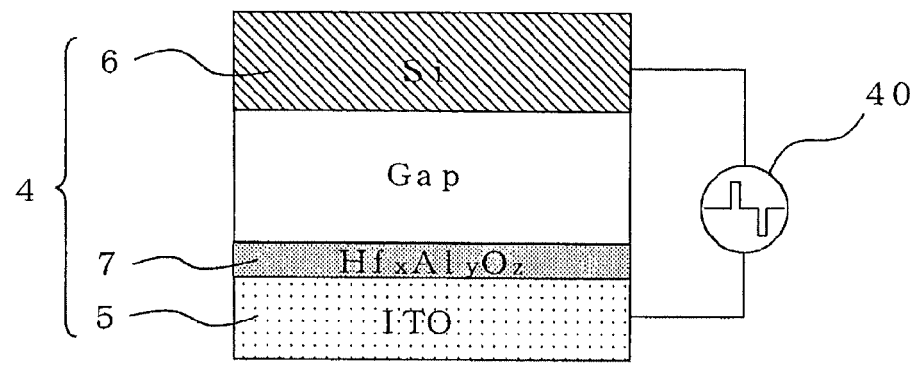
FIG. 7 is a sectional view enlarged from B area in FIG. 6.
Figure 8:
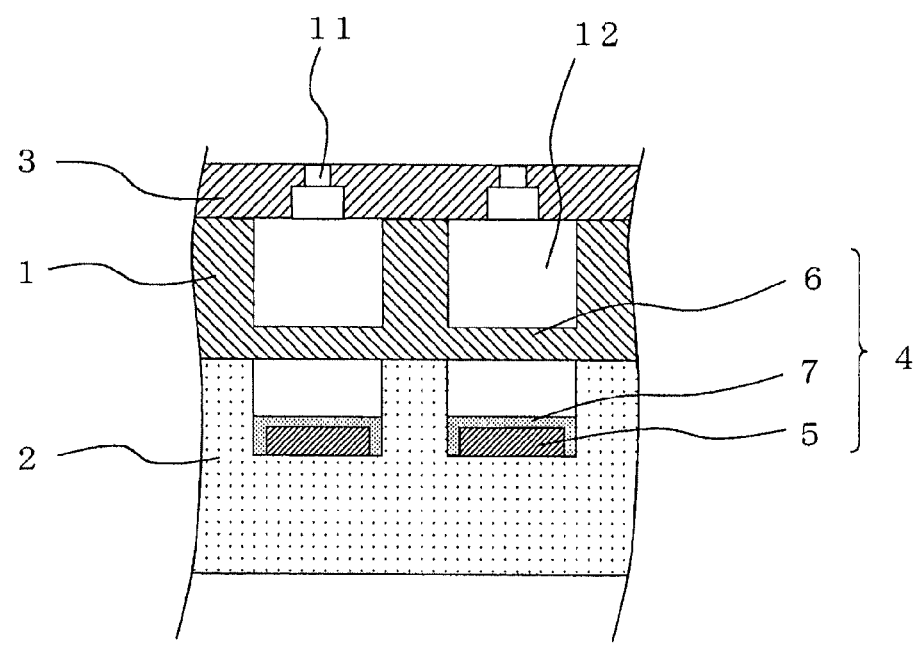
FIG. 8 is a sectional view enlarged from b-b line in FIG. 2

FIG. 6 is a perspective sectional view showing an inkjet head according to a second embodiment of the invention. FIG. 7 is a sectional view enlarged from B area in FIG. 6. FIG. 8 is a sectional view enlarged from b-b line in FIG. 2. In the second embodiment, t same numerical references are marked to portions corresponding to the same portions in the first embodiment if a specific notation is not described.

An electrostatic actuator 4 of the embodiment 2 includes the insulating film 7 made of $Hf_xAl_yO_z$ is formed by the ADL method on a surface of the individual electrode 5 opposing the oscillating electrode 6.

The embodiment 2 has a structure in which the insulating film is not formed on the oscillating plate 6 as a movable electrode, reducing bent of the oscillating plate 6 due to film stress, decreasing variations of gaps, and lowering variations of performance properties of actuators.

Third Embodiment

Figure 9:
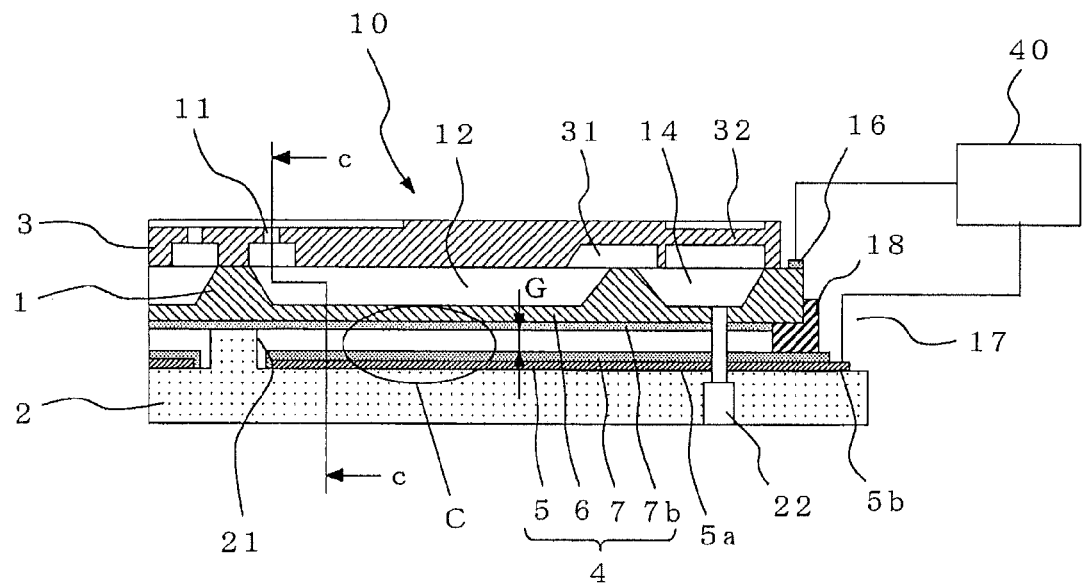
FIG. 9 is a perspective sectional view showing an inkjet head according to a third embodiment of the invention.
Figure 10:
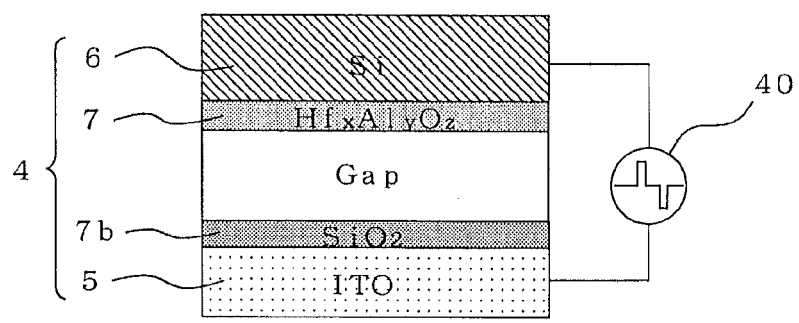
FIG. 10 is a sectional view enlarged from C area in FIG. 9.
Figure 11:
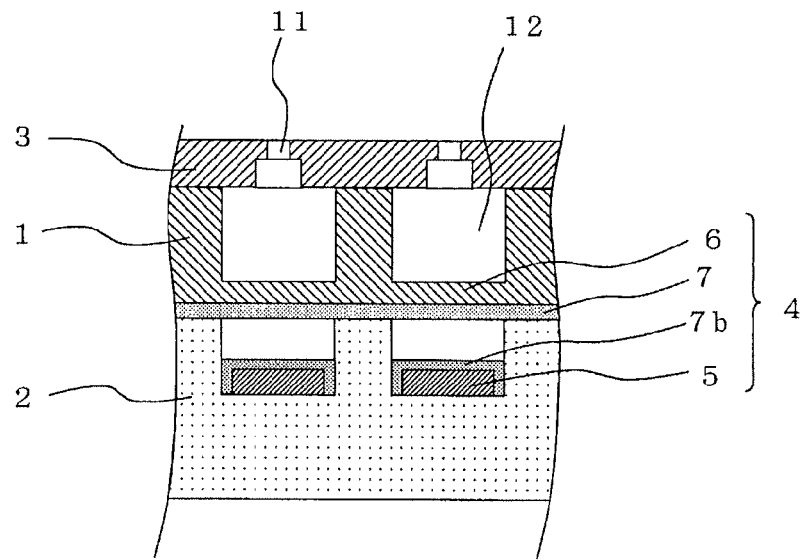
FIG. 11 is a sectional view enlarged from c-c line in FIG. 9.

FIG. 9 is a perspective sectional view showing an inkjet head 10 according to a third embodiment of the invention. FIG. 10 is a sectional view enlarged from C area in FIG. 9. FIG. 11 is a sectional view enlarged from c-c line in FIG. 9. The electrostatic actuator 4 of the third embodiment comprises one insulating film 7a on a surface of the oscillating plate 6 opposing the individual electrode 5 and the other insulating film 7b on a surface of the individual electrode 5 opposing the oscillating plate 6. The insulating film 7a is made of the $Hf_xAl_yO_z$ and formed by the ADL method and the insulating film 7b is made of $SiO_2$ and formed by chemical vapor deposition (CVD) with the thickness 20 nm. Here, the thickness of the $SiO_2$ film is appropriately determined by considering desirable a dielectric breakdown voltage and the generation pressure of an actuator.

The third embodiment shows a further improved dielectric breakdown voltage due to the $SiO_2$ film having a superior dielectric breakdown voltage compared to first and second embodiments.

Fourth Embodiment

Figure 12:
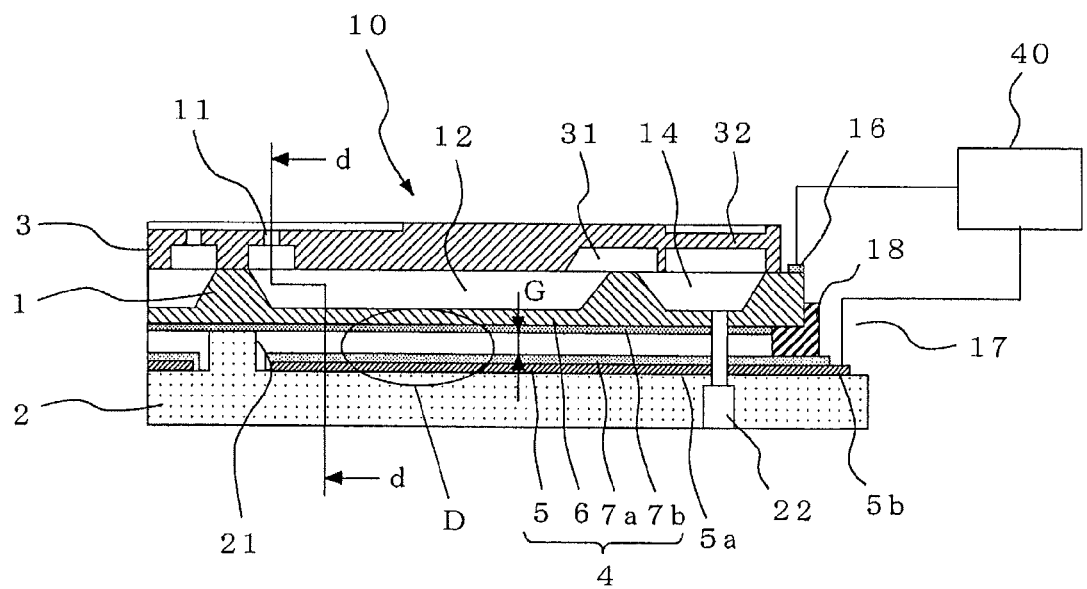
FIG. 12 is a perspective sectional view showing an inkjet head according to a fourth embodiment of the invention.
Figure 13:
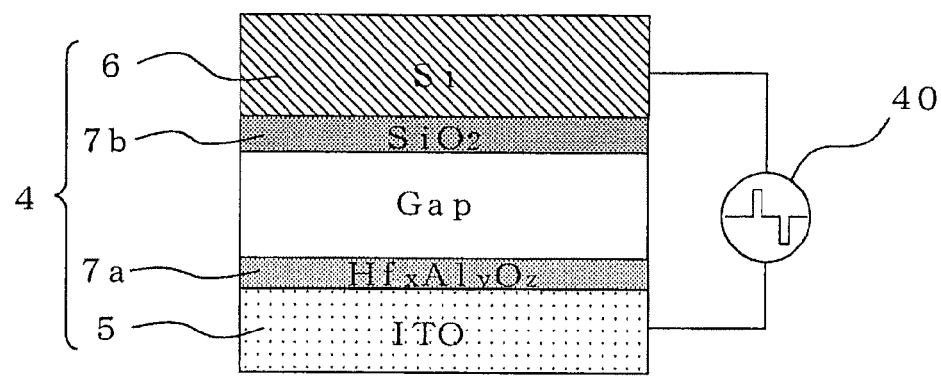
FIG. 13 is a sectional view enlarged from D area in FIG. 12.
Figure 14:
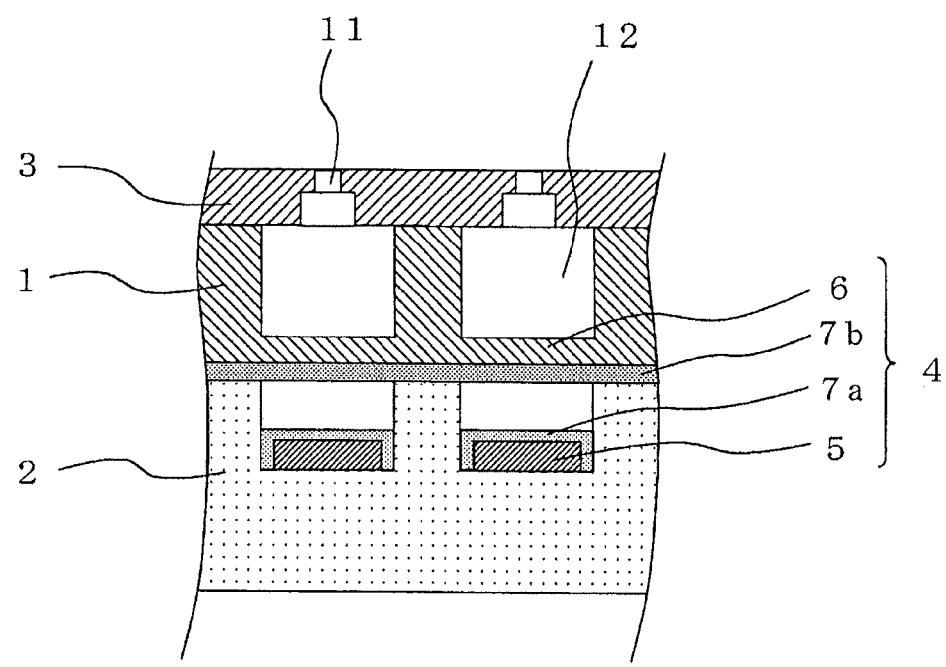
FIG. 14 is a sectional view enlarged from d-d line in FIG. 12.

FIG. 12 is a perspective sectional view showing an inkjet head 10 according to a fourth embodiment of the invention. FIG. 13 is a sectional view enlarged from D area in FIG. 12. FIG. 14 is a sectional view enlarged from d-d line in FIG. 12. The electrostatic actuator 4 of the fourth embodiment has a structure in which compositions of insulating films are inverted against that in the third embodiment. Namely, the electrostatic actuator 4 of the embodiment comprises one insulating film 7a on a surface of the individual electrode 5 opposing the oscillating plate 6 and the other insulating film 7b on a surface of the oscillating plate 6 opposing the individual electrode 5. The insulating film 7a is made of the $Hf_xAl_yO_z$ and formed by the ADL method and the insulating film 7b is made of $SiO_2$ and formed by chemical vapor deposition (CVD) with the thickness 20 nm.

Therefore, the fourth embodiment has the same advantages of the third embodiment.

Fifth Embodiment

Figure 15:
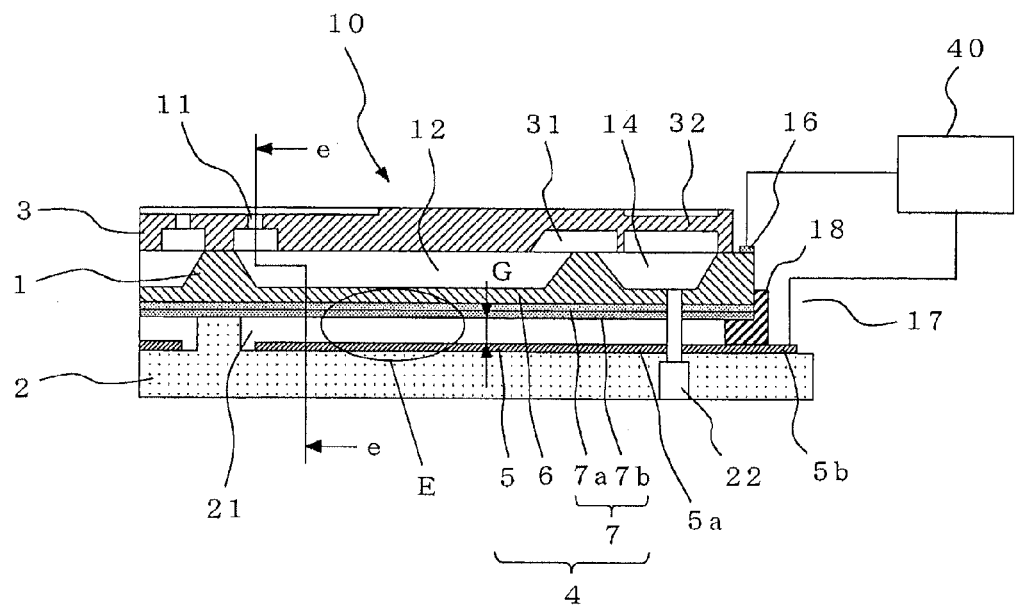
FIG. 15 is a perspective sectional view showing an inkjet head according to a fifth embodiment of the invention.
Figure 16:
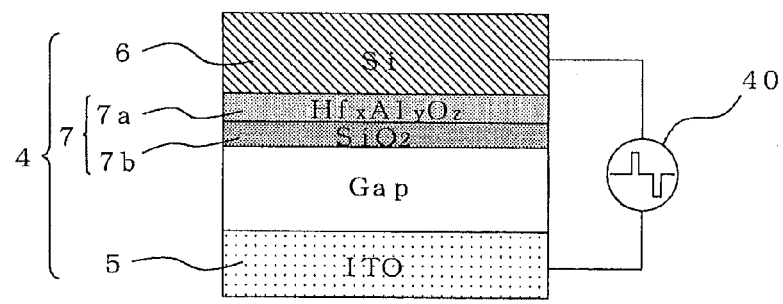
FIG. 16 is a sectional view enlarged from E area in FIG. 15.
Figure 17:
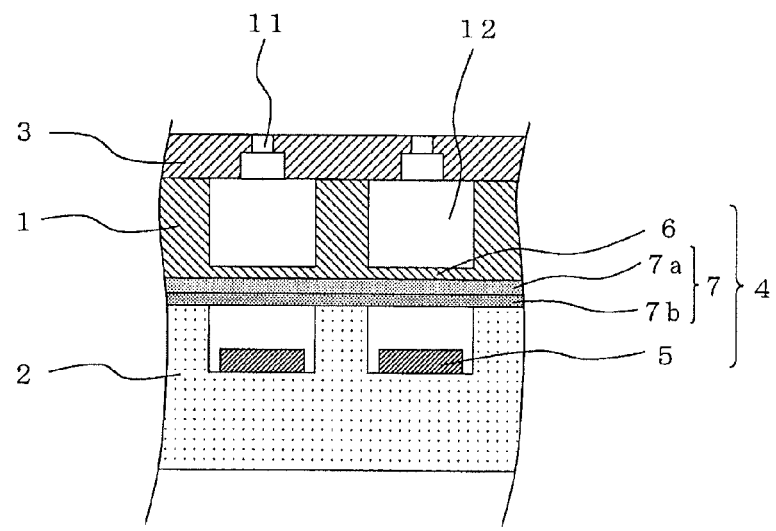
FIG. 17 is a sectional view enlarged from e-e line in FIG. 15.

FIG. 15 is a perspective sectional view showing an inkjet head 10 according to a fifth embodiment of the invention. FIG. 16 is a sectional view enlarged from E area in FIG. 15. FIG. 17 is a sectional view enlarged from e-e line in FIG. 15. The electrostatic actuator 4 of the fifth embodiment comprises one insulating film 7a on a surface of the oscillating plate 6 opposing the individual electrode 5 and further the other insulating film 7b on a surface of the one insulating film 7a. The insulating film 7a is made of $Hf_xAl_yO_z$ and formed by the ADL method and the insulating film 7b is made of $SiO_2$ and formed by chemical vapor deposition (CVD) with the thickness 20 nm.

Technical advantages of the embodiment 5 are followings.

(1) Improving Discharging Capability

Further forming the $Hf_xAl_yO_z$ film improves the relative permittivity compared to a single layer SiO2 as the insulating film, increasing generation pressure of an actuator. This result can further enhance discharging capability of an ink jet head.

(2) Improving Dielectric Breakdown Voltage

A dielectric breakdown voltage is improved due to the $SiO_2$ film having a superior dielectric breakdown voltage.

(3) Securing Strength of Bonding

The strength of bonding is secured as the same of that in the conventional electrostatic actuator.

(4) Simple Manufacturing Process

A manufacturing process is simple since $Hf_xAl_yO_z$ and $SiO_2$ are deposited only on an entire surface of the silicon substrate.

Sixth Embodiment

Figure 18:
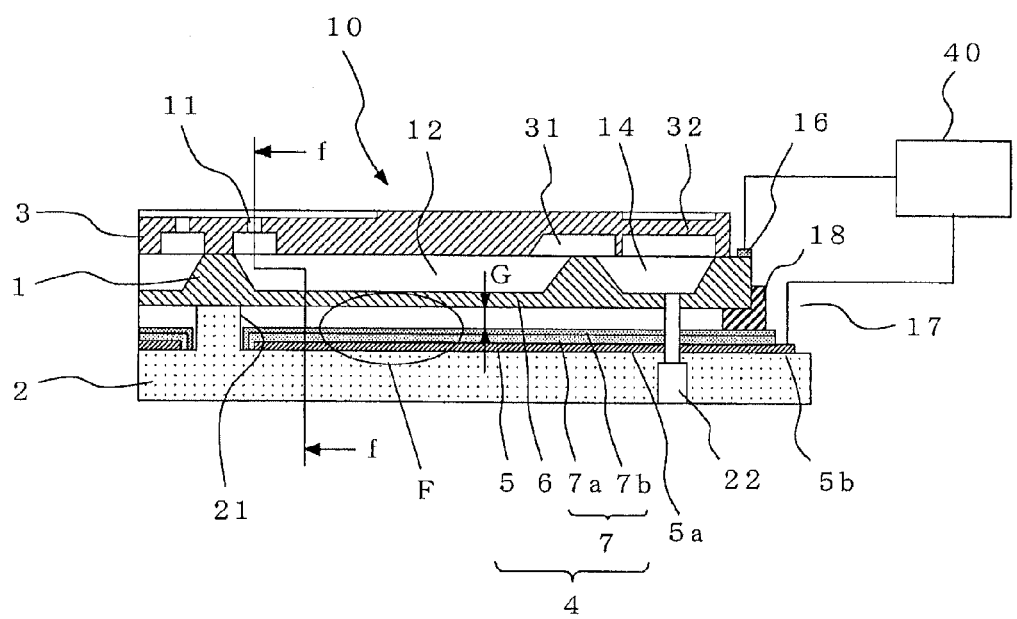
FIG. 18 is a perspective sectional view showing an inkjet head according to a sixth embodiment of the invention.

FIG. 18 is a perspective sectional view showing an inkjet head 10 according to a sixth embodiment of the invention.

Figure 19:
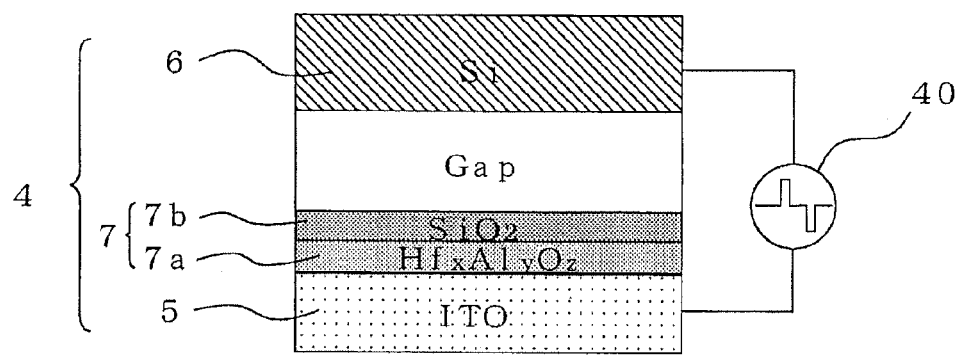
FIG. 19 is a sectional view enlarged from F area in FIG. 18.
Figure 20:
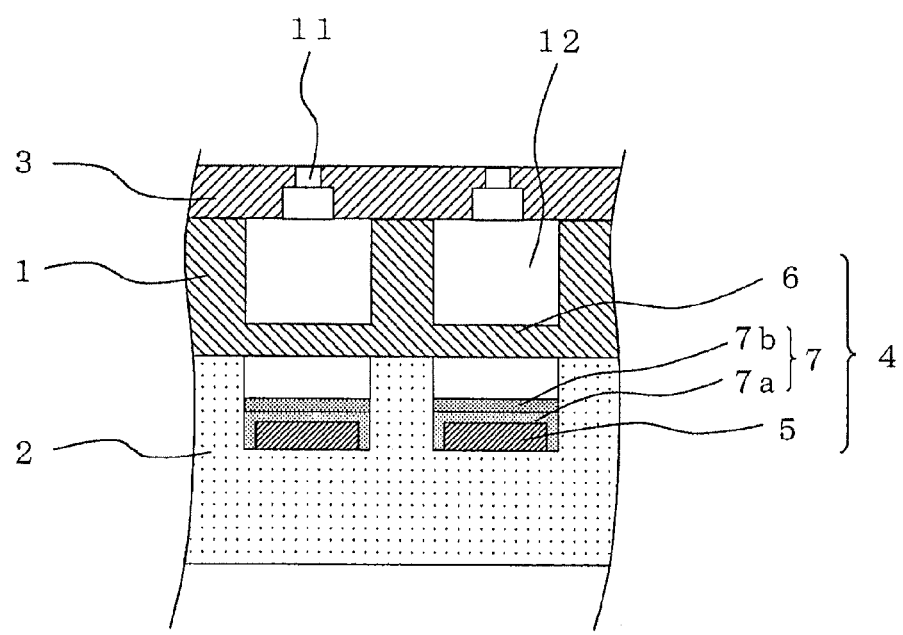
FIG. 20 is a sectional view enlarged from f-f line in FIG. 18.

FIG. 19 is a sectional view enlarged from F area in FIG. 18. FIG. 20 is a sectional view enlarged from f-f line in FIG. 18. The electrostatic actuator 4 of the embodiment sixth has a structure in which compositions of insulating films in the embodiment 5 are formed on the individual electrode 5. Namely, this actuator comprises one insulating film 7a made of $Hf_xAl_yO_z$ and formed by the ADL method on a surface of the individual electrode 5 opposing the oscillating plate 6 and further the other insulating film 7b made of $SiO_2$ and formed by chemical vapor deposition (CVD) with the thickness 20 nm on a surface of the $Hf_xAl_yO_z$ film 7a.

The embodiment 6 has a structure in which the insulating film is not formed on the oscillating plate 6 as a movable electrode, reducing bent of the oscillating plate 6 due to film stress, decreasing variation of gaps, and lowering variations of performance properties of actuators.

Seventh Embodiment

Figure 21:
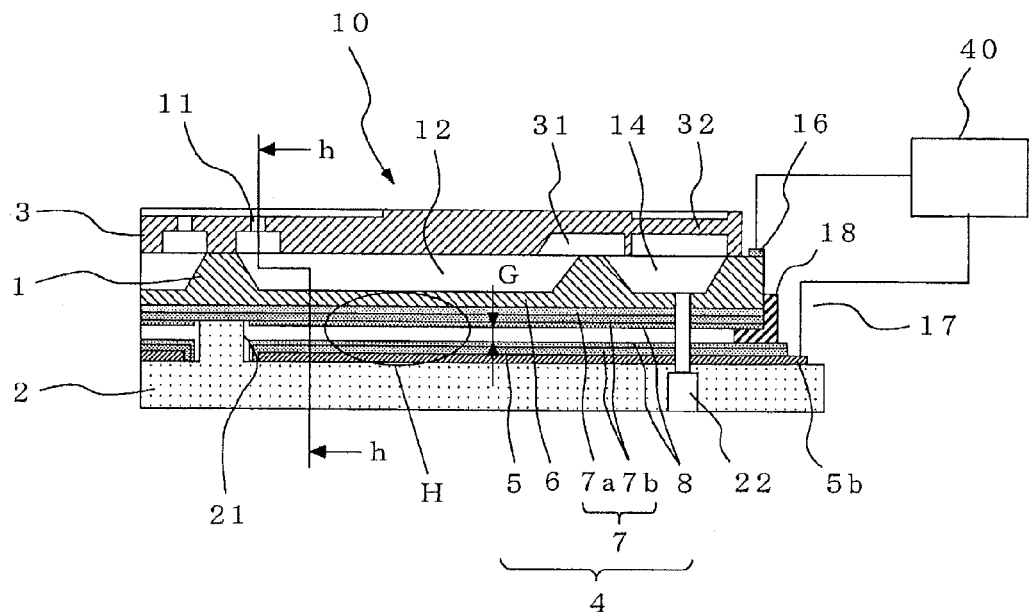
FIG. 21 is a perspective sectional view showing an inkjet head according to a seventh embodiment of the invention.
Figure 22:
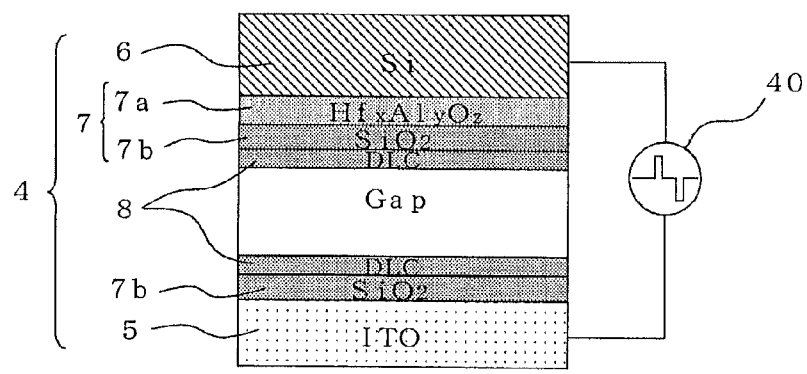
FIG. 22 is a sectional view enlarged from H area in FIG. 21.
Figure 23:
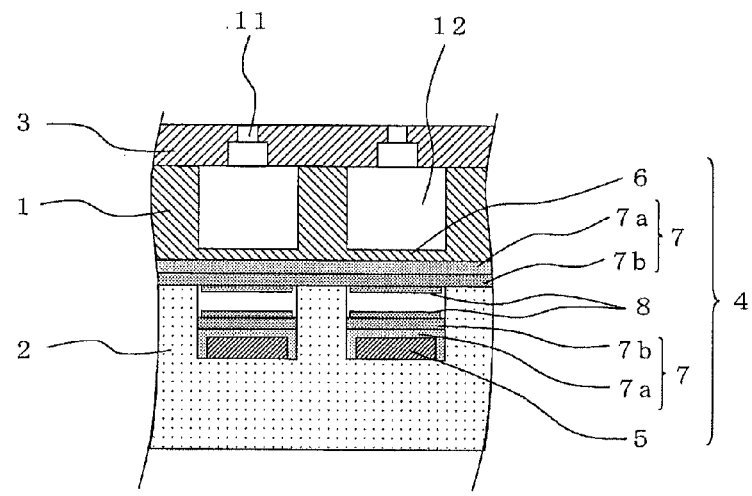
FIG. 23 is a sectional view enlarged from h-h line in FIG. 21.

FIG. 21 is a perspective sectional view showing an inkjet head 10 according to a seventh embodiment of the invention. FIG. 22 is a sectional view enlarged from H area in FIG. 21. FIG. 23 is a sectional view enlarged from h-h line in FIG. 21. The electrostatic actuator 4 of the seventh embodiment comprises the insulating film 7 having multi layered structure in which the $Hf_xAl_yO_z$ film 7a and the $SiO_2$ film 7b thereon are formed, the $SiO_2$ film 7b formed on the individual electrode and a DLC film as a surface protecting film 8 formed on the above two $SiO_2$ films 7b. The thickness and relative permittivity of each of films is shown in the table 1. Here, the thickness of each of films is not limited to the following similar to the other embodiments and appropriately determined by considering desirable dielectric breakdown voltage and the generation pressure of an electrostatic actuator.

TABLE 1

| Materials for an insulating film | Thickness (nm) | Relative premittivity |
|---|---|---|
| $Hf_xAl_yO_z$ | 60 | 11 |
| $SiO_2$ (Si side) | 20 | 3.9 |
| DLC((Si side) | 10 | 5 |
| DLC((ITO side) | 10 | 5 |
| $SiO_2$ (ITO side) | 20 | 3.9 |

The surface protecting film 8 is made of one of ceramic hardened films such as TiN, TiC, TiCN, TiAlN and others, carbon hardened films as diamond and diamond like carbon. In particular, DLC is preferable since the adhesiveness with SiO2 film as an under insulating film is superior. The DLC film has a surface having extreme smoothness and low friction. DLC is used in the present seventh and eighth to twelfth embodiments.

According to a performance test of an actuator having the above seventh embodiment, the equivalent oxide thickness (EOT) was 76 nm and a dielectric breakdown voltage was 56 V realizing high voltage driving, EOT is the value calculated by converting the thickness of the $Hf_xAl_yO_z$ film into the electrical thickness equivalent to the $SiO_2$ film. Further, leak current density was under 100 nA/cm²(at 30V.)

Further, the seventh embodiment shows the following advantages.

(1) Compatibility of Improving Discharging Capability with Securing a Dielectric Breakdown Voltage The $Hf_xAl_yO_z$ film increases relative permittivity comparing with that of the $SiO_2$ insulating film, enhancing the generation pressure of an electrostatic actuator. Further, using the $Hf_xAl_yO_z$ film enhances a dielectric breakdown voltage compared to multi layered structure of $HfO_2$ and $Al_2O_3$, does not receive the constraint of low applied voltage. As the result, improving discharging capability is compatible with securing a dielectric breakdown voltage.

(2) Improving Durability of an Actuator

The durability of an actuator is fairly improved since the DLC film is formed as a surface protection film on the both sides of insulating films.

(3) Fair Adhesiveness of DLC Film

The adhesiveness of the DLC film is fairly improved since the $SiO_2$ film is formed under the DLC film. As a result, the durability of driving an actuator is fairly improved since the above adhesiveness constrains flaking of the DLC film and deterioration such as being worn out due to repeated contact with and removed from the oscillating plate caused by driving an actuator.

(4) Constraining Contact Discharge Amounts

Contact discharge amounts can be restrained since the DLC films on both sides are contact each other. Such restraint attains stable performance of an actuator without any fluctuation.

Eighth Embodiment

Figure 24:
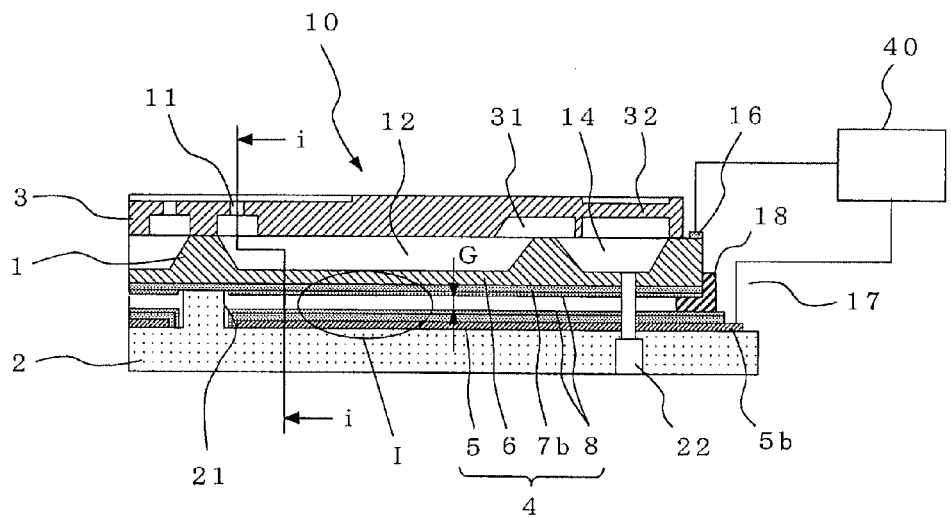
FIG. 24 is a perspective sectional view showing an inkjet head according to an eighth embodiment of the invention.
Figure 25:
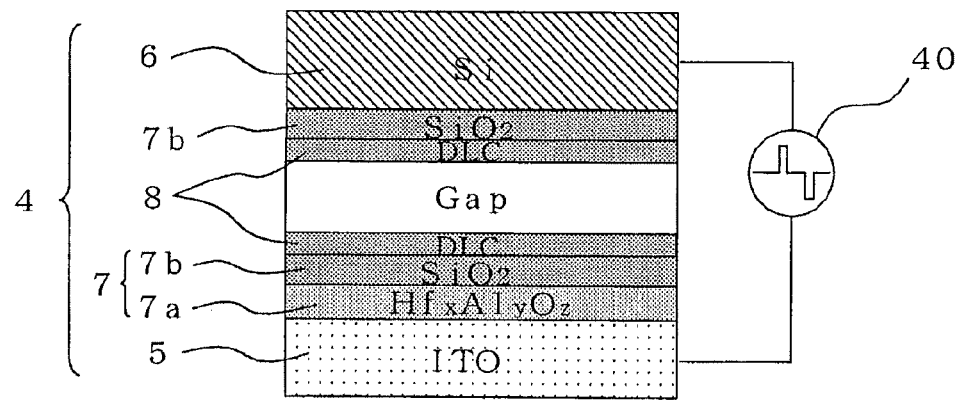
FIG. 25 is a sectional view enlarged from I area in FIG. 24.
Figure 26:
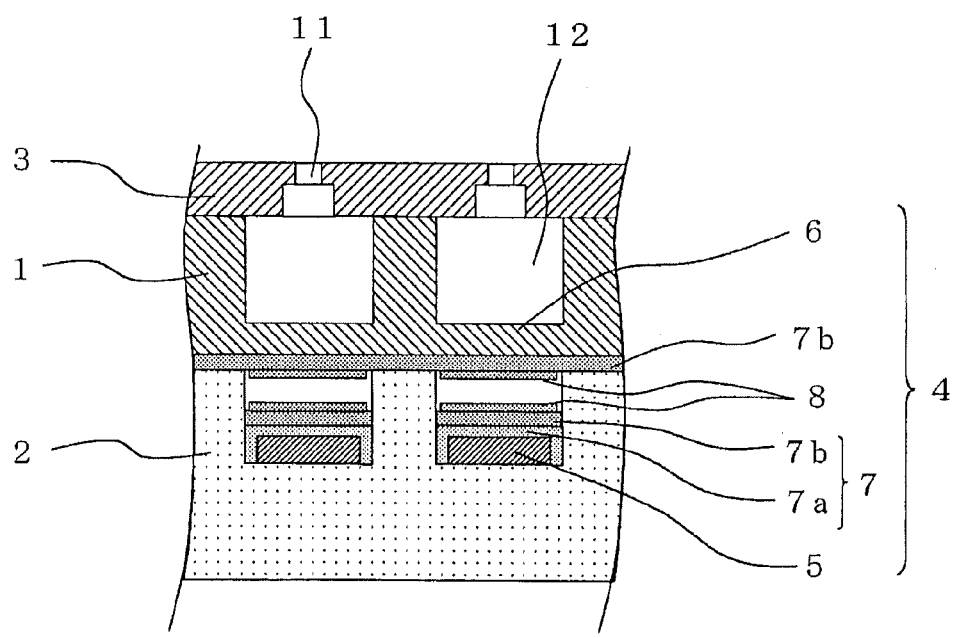
FIG. 26 is a sectional view enlarged from i-i line in FIG. 24.

FIG. 24 is a perspective sectional view showing an inkjet head 10 according to an eighth embodiment of the invention. FIG. 25 is a sectional view enlarged from I area in FIG. 24. FIG. 26 is a sectional view enlarged from i-i line in FIG. 24.

The electrostatic actuator 4 of the eighth embodiment has a structure which is inverted against that of the seventh embodiment. Namely, this structure has the he $Hf_xAl_yO_z$ film formed on the side of the individual electrode. The DLC films as the surface protecting films 8 are formed on both sides of the $SiO_2$ film 7b similar to the seventh embodiment.

The eighth embodiment thins the thickness of the insulating film formed on the oscillating plate, reducing bent of the oscillating plate due to a film stress, decreasing variations of gaps, and lowering variations of performance properties of actuators. Other advantages are the same in the seventh embodiment.

Ninth Embodiment

Figure 27:
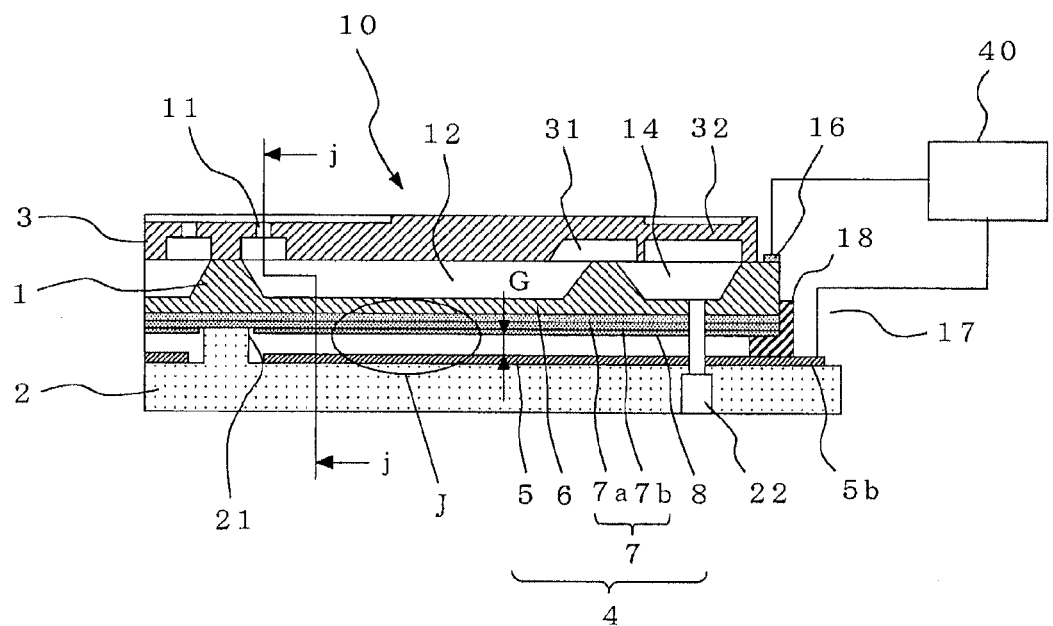
FIG. 27 is a perspective sectional view showing an inkjet head according to a ninth embodiment of the invention.
Figure 28:
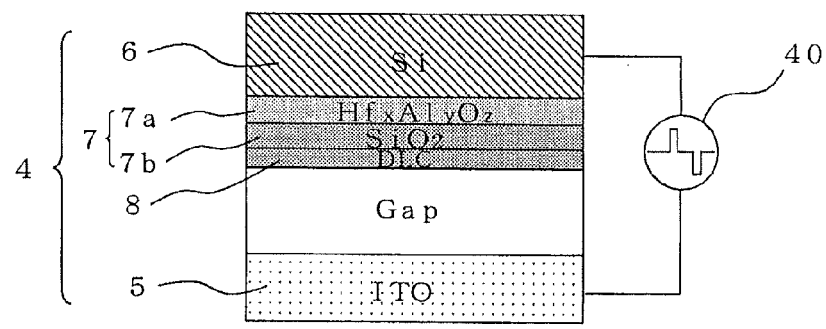
FIG. 28 is a sectional view enlarged from J area in FIG. 27.
Figure 29:
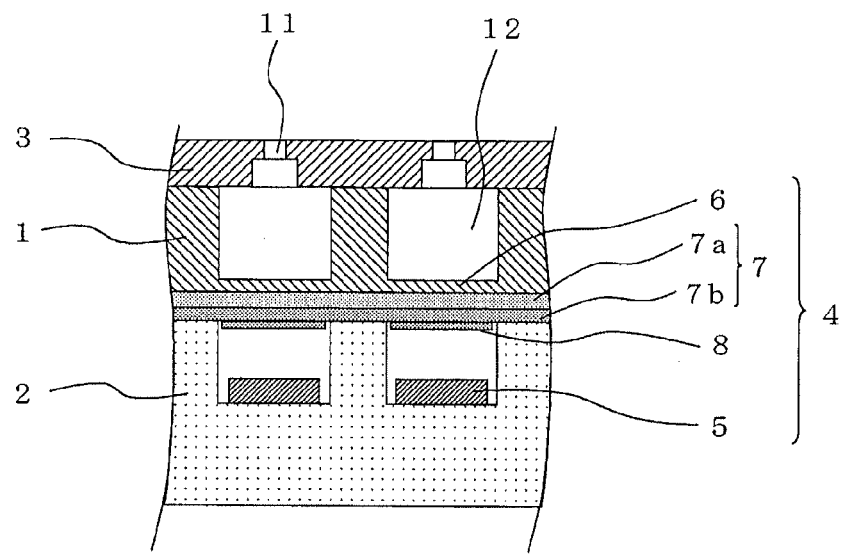
FIG. 29 is a sectional view enlarged from j-j line in FIG. 27.

FIG. 27 is a perspective sectional view showing an inkjet head 10 according to a ninth embodiment of the invention. FIG. 28 is a sectional view enlarged from J area in FIG. 27. FIG. 29 is a sectional view enlarged from j-j line in FIG. 27. The electrostatic actuator 4 of the ninth embodiment has a structure in which the insulating film and the surface protecting film are not formed on the side of the individual electrode. Instead, it has a structure in which the insulating film 7 comprising the $Hf_xAl_yO_z$ film 7a and the $SiO_2$ film 7b as multi layers is formed only on the oscillating plate similar to the seventh embodiment, further the DLC film with the thickness 10 nm is formed as the surface protecting film 8 on the $SiO_2$ film 7b.

Technical advantages of the embodiment 9 are followings.

(1) Compatibility of Improving Discharging Capability with Securing a Dielectric Breakdown Voltage The $Hf_xAl_yO_z$ film increases relative permittivity comparing with that of the $SiO_2$ insulating film, enhancing the generation pressure of an electrostatic actuator. Further, as similar to the first embodiment, using the $Hf_xAl_yO_z$ film enhances a dielectric breakdown voltage compared to multi layered structure of $HfO_2$ and $Al_2O_3$, does not receive the constraint of low applied voltage. As the result, improving discharging capability is compatible with securing a dielectric breakdown voltage (2) Improving Durability of an Actuator The durability of an actuator is improved since the DLC film is formed as a surface protecting film on the oscillating plate.

(3) Simple Manufacturing Process

The $Hf_xAl_yO_z$ film and the $SiO_2$ film are formed on an entire surface of the silicon substrate, simplifying a manufacturing process compared to a case of forming these insulating films on the individual electrode 5 since removing the $Hf_xAl_yO_z$ film and the $SiO_2$ film is not necessary.

Tenth Embodiment

Figure 30:
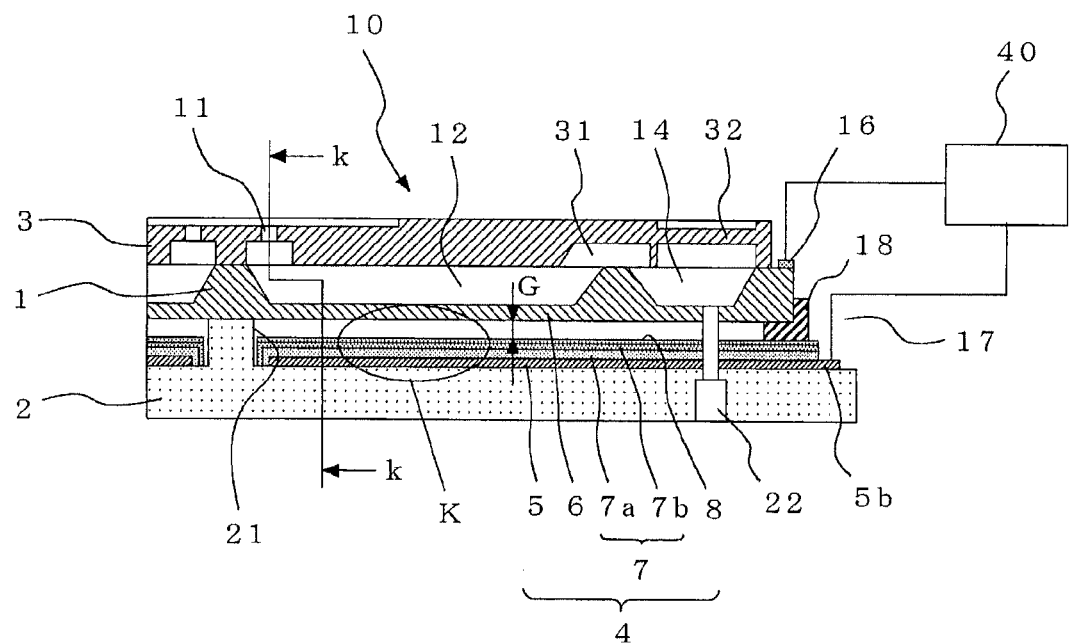
FIG. 30 is a perspective sectional view showing an inkjet head according to a tenth embodiment of the invention.
Figure 31:
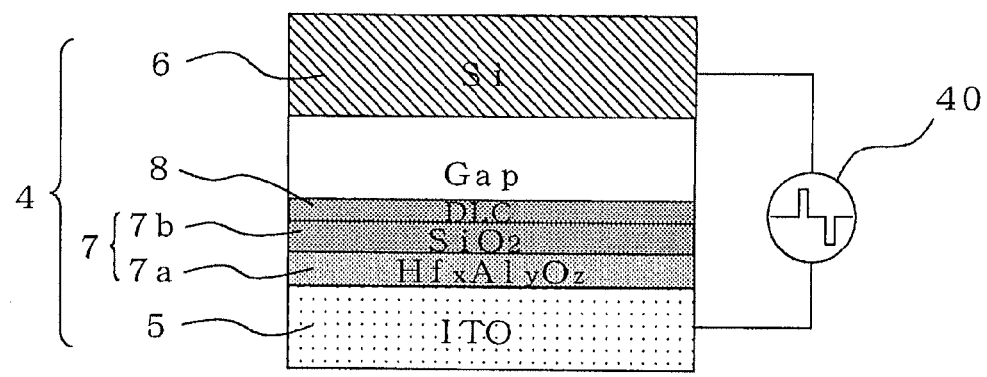
FIG. 31 is a sectional view enlarged from K area in FIG. 30.
Figure 32:
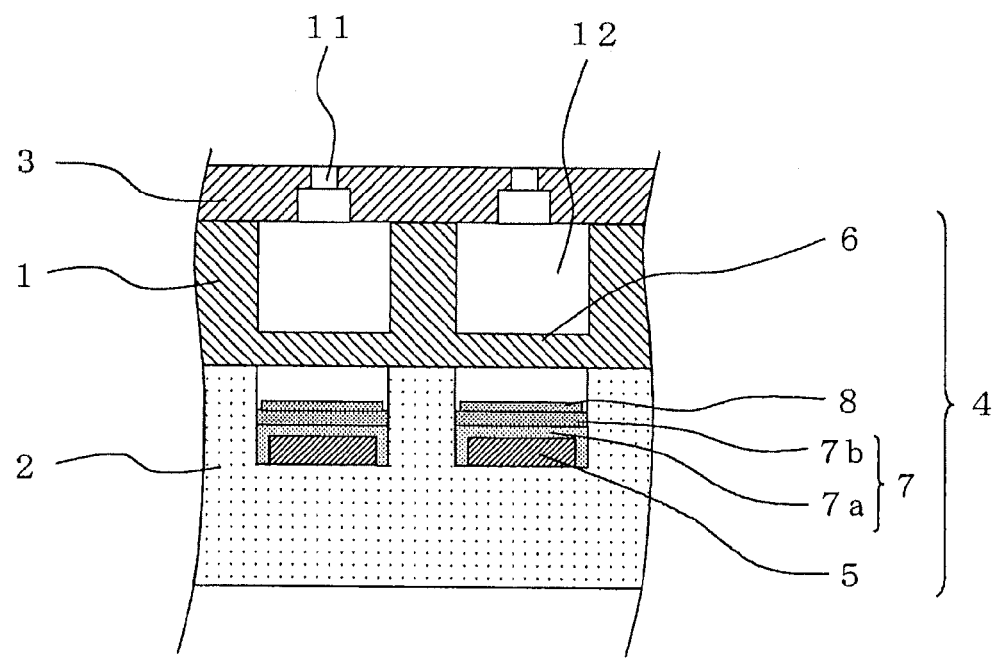
FIG. 32 is a sectional view enlarged from k-k line in FIG. 30.

FIG. 30 is a perspective sectional view showing an inkjet head 10 according to a tenth embodiment of the invention. FIG. 31 is a sectional view enlarged from K area in FIG. 30. FIG. 32 is a sectional view enlarged from k-k line in FIG. 30.

The electrostatic actuator 4 of the tenth embodiment has a structure in which the insulating film and the surface protecting film are formed on the side of the individual electrode 5 contrary to the embodiment 9. Further, it has the DLC film formed as the surface protecting film 8 on the $SiO_2$ film 7b.

The tenth embodiment has a structure in which the insulating film is not formed on the side of the oscillating plate, reducing bent of the oscillating plate due to a film stress, decreasing variations of gaps, and lowering variations of performance properties of actuators.

Eleventh Embodiment

Figure 33:
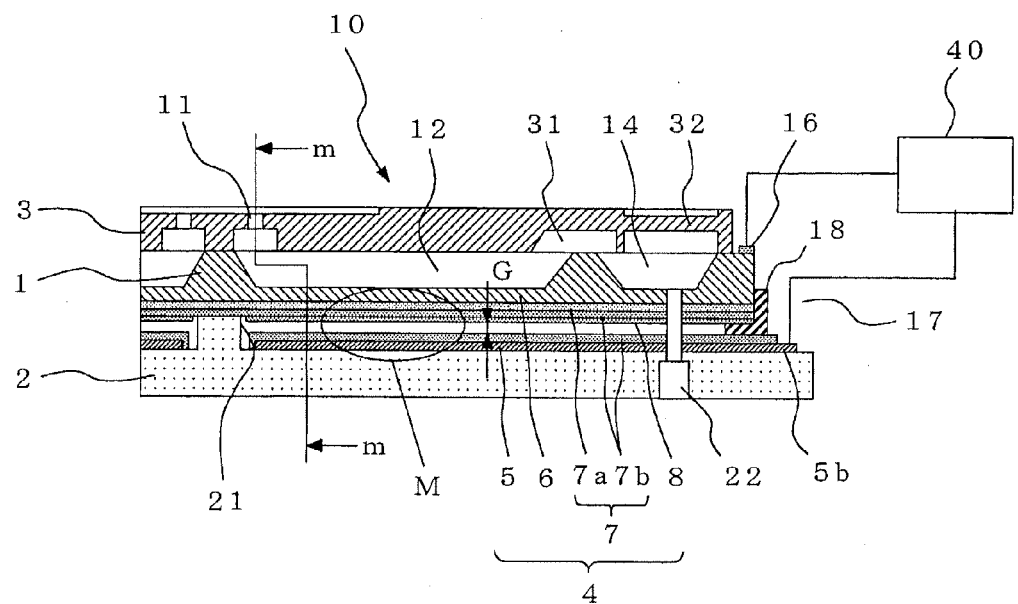
FIG. 33 is a perspective sectional view showing an inkjet head according to an eleventh embodiment of the invention.
Figure 34:
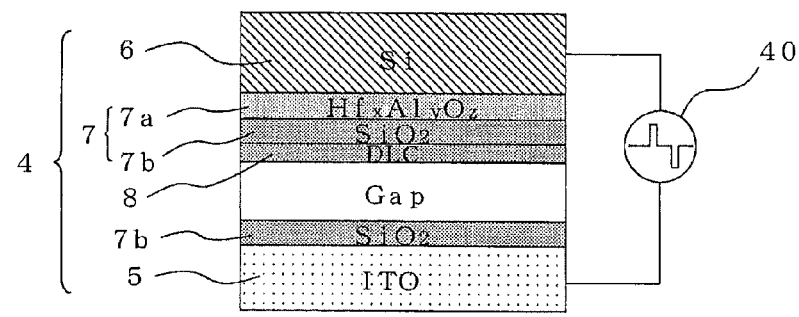
FIG. 34 is a sectional view enlarged from M area in FIG. 33.
Figure 35:
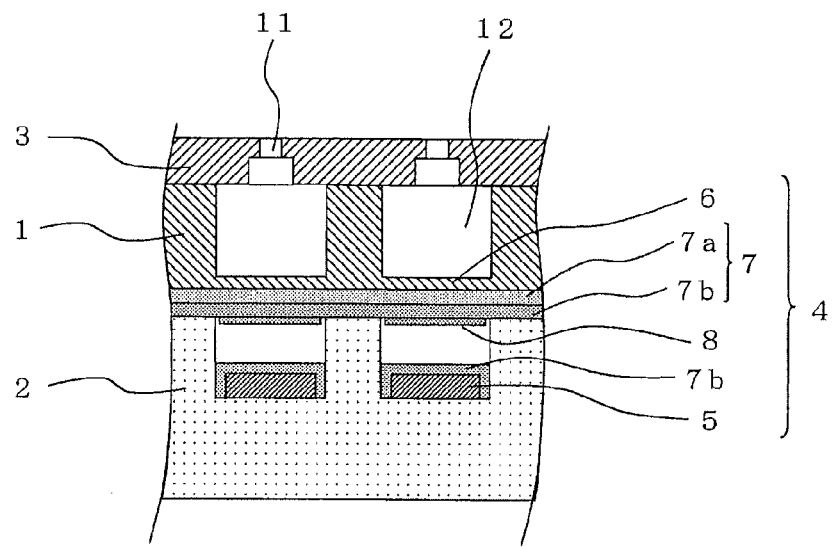
FIG. 35 is a sectional view enlarged from m-m line in FIG. 33.

FIG. 33 is a perspective sectional view showing an inkjet head 10 according to an eleventh embodiment of the invention. FIG. 34 is a sectional view enlarged from M area in FIG. 33. FIG. 35 is a sectional view enlarged from m-m line in FIG. 33.

The electrostatic actuator 4 of the eleventh embodiment comprises the insulating film 7 having multi layered structure in which the $Hf_xAl_yO_z$ film 7a and the $SiO_2$ film 7b thereon are formed similar to the ninth embodiment. Further, it has a DLC film as a surface protecting film 8 formed on the $SiO_2$ film 7b. The $SiO_2$ film 7b is formed only on the individual electrode with the thickness 20 nm.

Technical advantages of the eleventh embodiment are followings.

(1) Compatibility of Improving Discharging Capability with Securing a Dielectric Breakdown Voltage.

The $Hf_xAl_yO_z$ film increases relative permittivity comparing with that of the $SiO_2$ insulating film, enhancing the generation pressure of an electrostatic actuator. Further, as similar to the first embodiment, using the $Hf_xAl_yO_z$ film enhances a dielectric breakdown voltage compared to multi layered structure of $HfO_2$ and $Al_2O_3$, and does not receive the constraint of low applied voltage. As the result, improving discharging capability is compatible with securing a dielectric breakdown voltage.

(2) Improving Durability of an Actuator

The durability of an actuator is improved since the DLC film is formed as a surface protecting film on the oscillating plate.

(3) Simple Manufacturing Process

The manufacturing process is simplified since removing the DLC film is not necessary, compared to the seventh embodiment (4) Constraining Contact Discharge Amounts The DLC film and the $SiO_2$ film constrain contact discharge amounts, compared to the direct contact of the DLC film to the ITO film. Such restraint attains stable performance of an actuator without any fluctuation.

Twelfth Embodiment

Figure 36:
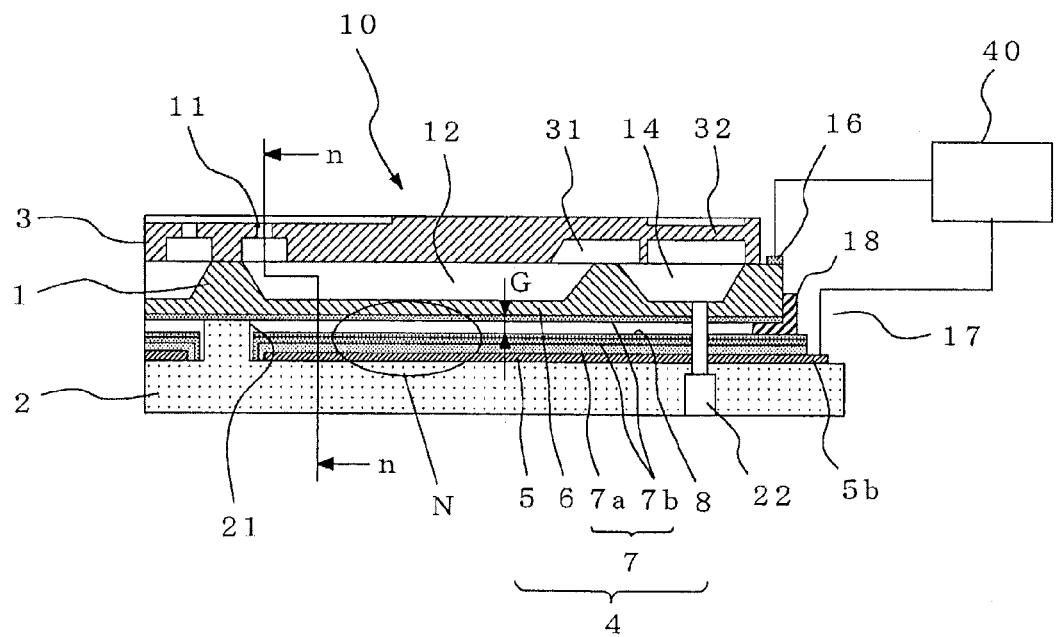
FIG. 36 is a perspective sectional view showing an inkjet head according to a twelfth embodiment of the invention.
Figure 37:
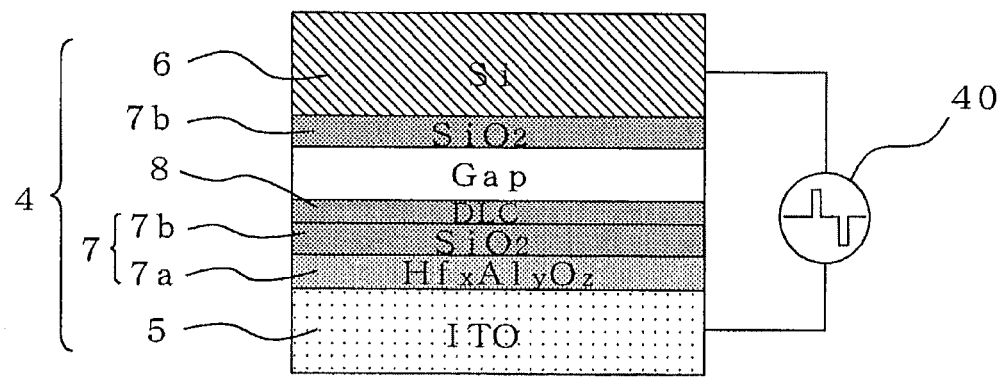
FIG. 37 is a sectional view enlarged from N area in FIG. 36.
Figure 38:
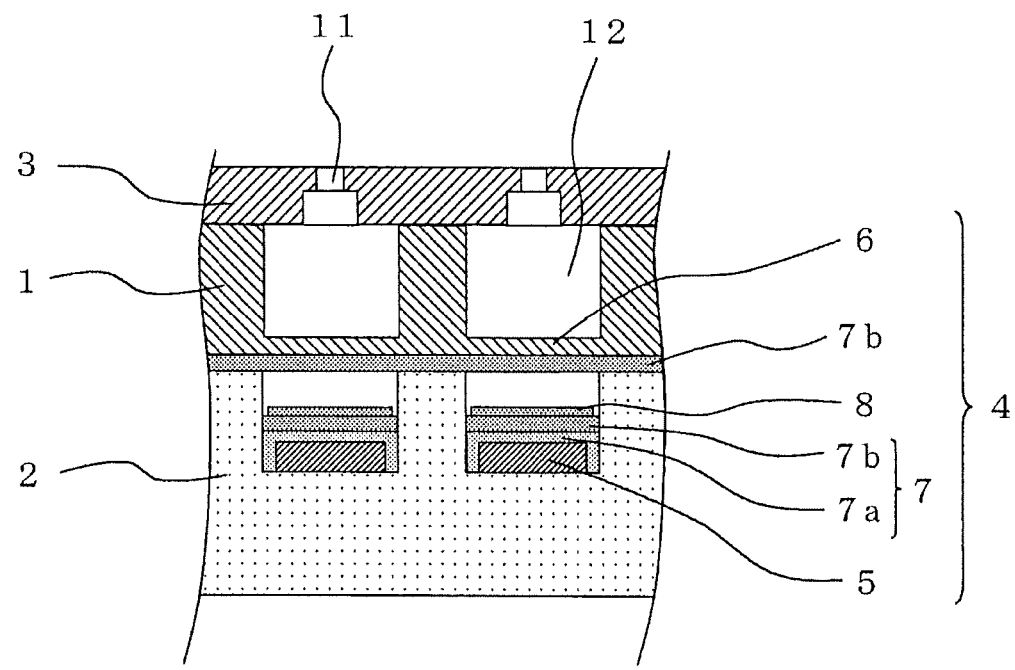
FIG. 38 is a sectional view enlarged from n-n line in FIG. 36.

FIG. 36 is a perspective sectional view showing an inkjet head 10 according to a twelfth embodiment of the invention. FIG. 37 is a sectional view enlarged from N area in FIG. 36. FIG. 38 is a sectional view enlarged from n-n line in FIG. 36.

The electrostatic actuator 4 of the twelfth embodiment comprises the insulating film 7 formed on the side of individual electrode, having multi layered structure in which the $Hf_xAl_yO_z$ film 7a and the $SiO_2$ film 7b thereon are formed, contrary to the eleventh embodiment. Further, it has a DLC film as the surface protecting film 8 formed on the $SiO_2$ film 7b. The $SiO_2$ film 7b is formed only on the oscillating plate.

The twelfth embodiment thins the thickness of the insulating film formed on the oscillating plate, reducing bent of the oscillating plate due to a film stress, decreasing variations of gaps, and lowering variations of performance properties of actuators. Further, the DLC film and the $SiO_2$ film constrain contact discharge amounts, compared to the direct contact of the DLC film to the ITO film. Such restraint attains stable performance of an actuator without any fluctuation.

The inkjet head 10 is provided with the electrostatic actuator 4 having the above structure, showing superior stability of driving durability and stability even the actuator is miniaturized, making it possible to realize high speed drive and high density.

Here, the above embodiments includes a structure in which the insulating film 7 made of $Hf_xAl_yO_z$ is formed by the ALD method on one of the individual electrode 5 and the oscillating electrode 6. But, the film may be formed on both the individual electrode 5 and the oscillating electrode 6

Figure 39:
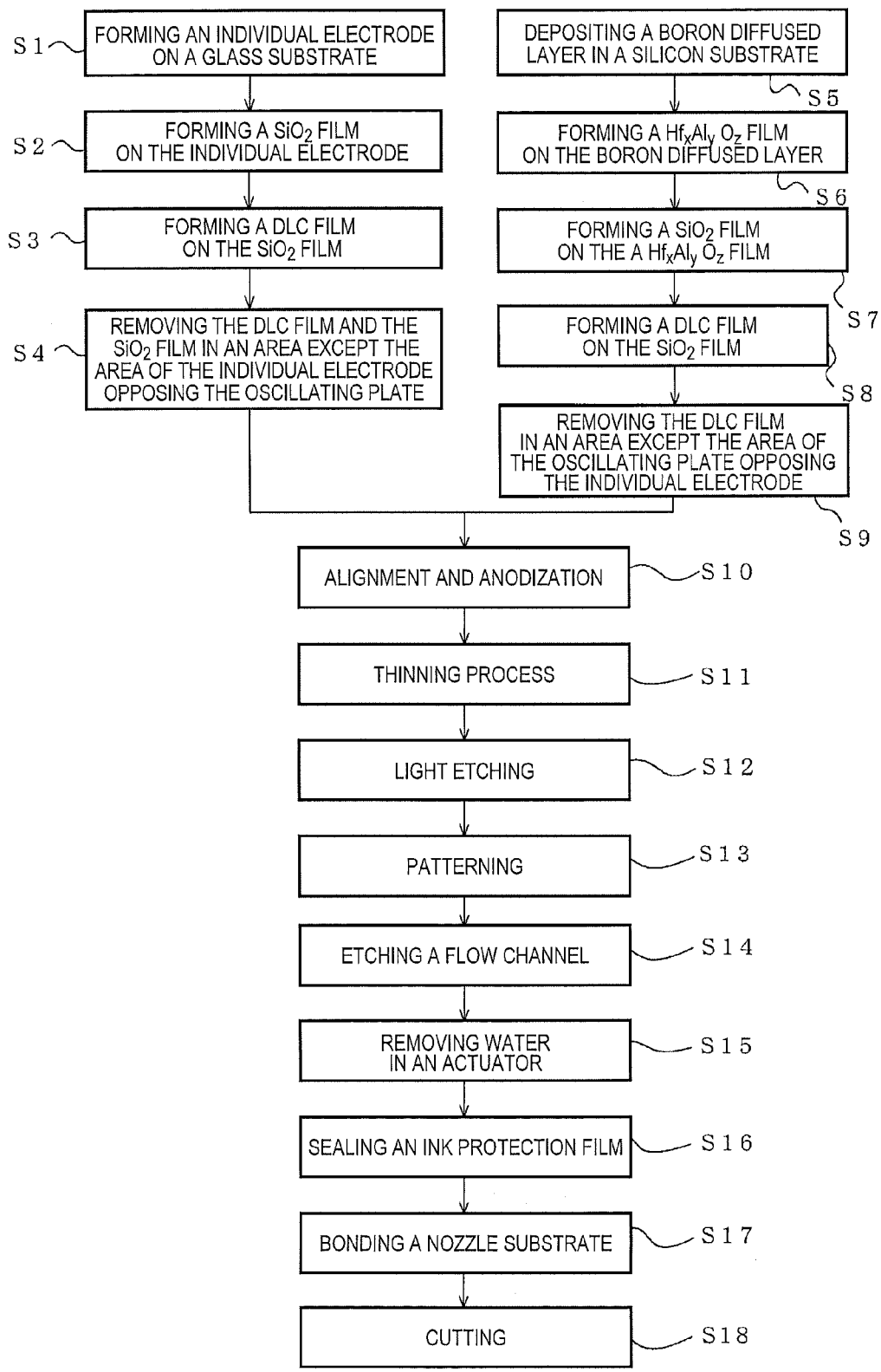
FIG. 39 is a flow chart showing brief processes for manufacturing an inkjet head.
Figure 40A:
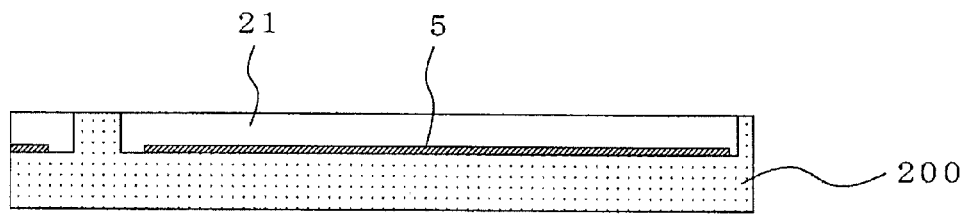
FIG. 40 is a sectional view showing brief processes for manufacturing an electrode substrate.
Figure 40B:
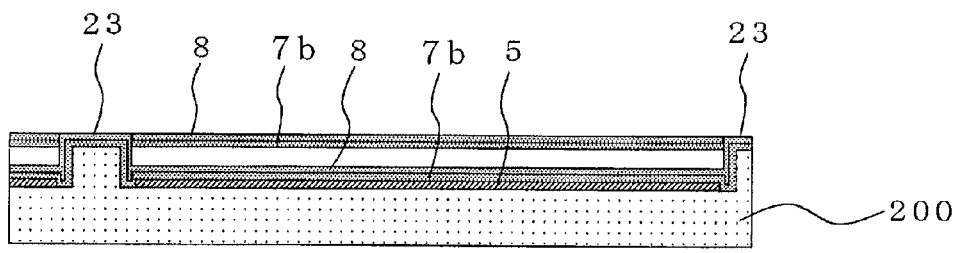
Figure 40C:
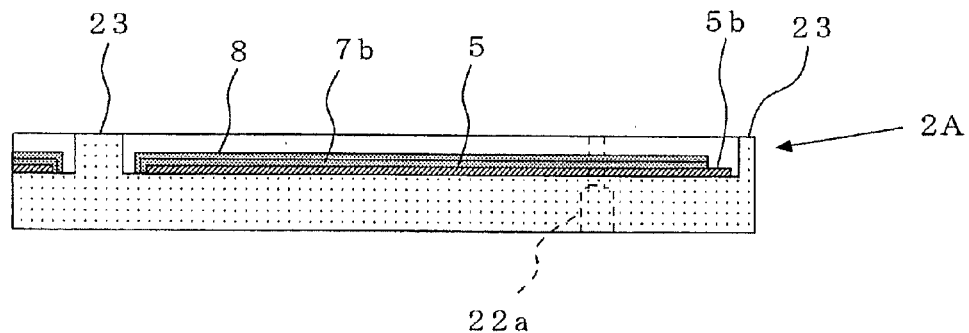
Figure 41A:
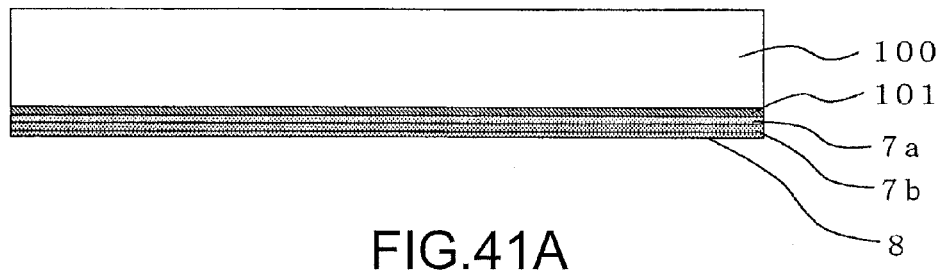
FIG. 41 shows a sectional view showing brief processes for manufacturing an ink jet head.
Figure 41B:
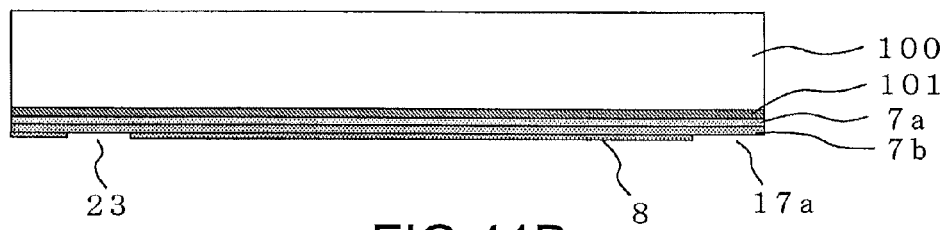
Figure 41C:
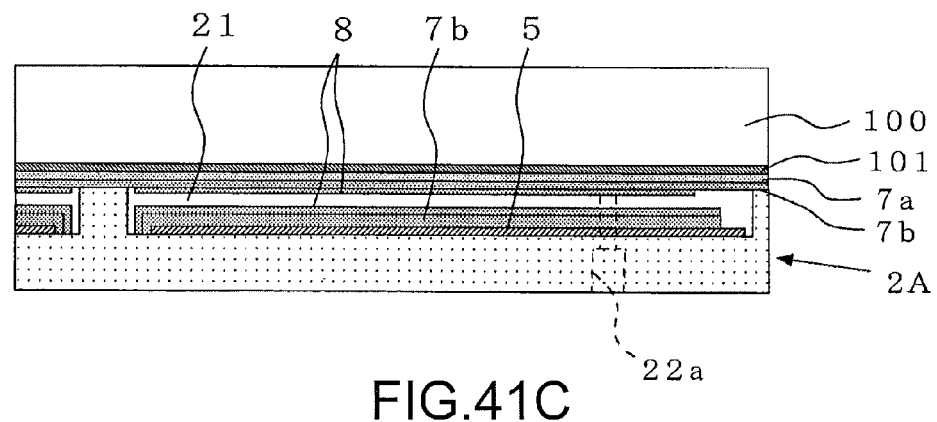
Figure 41D:
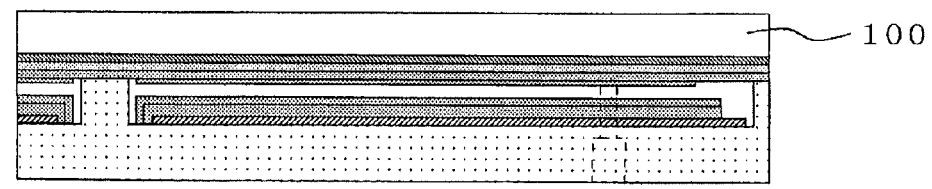
Figure 42E:
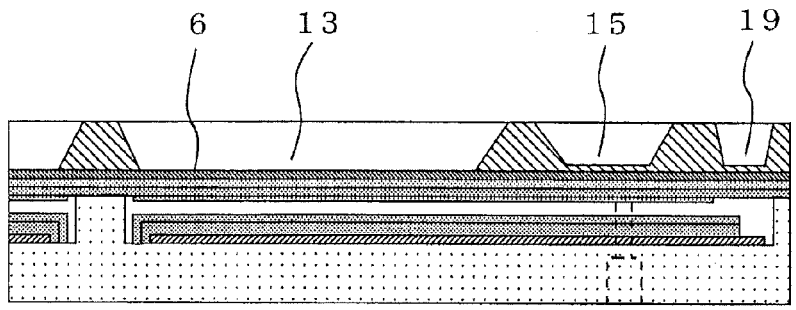
FIG. 42 is a sectional view showing briefly manufacturing processes following FIG. 41
Figure 42F:
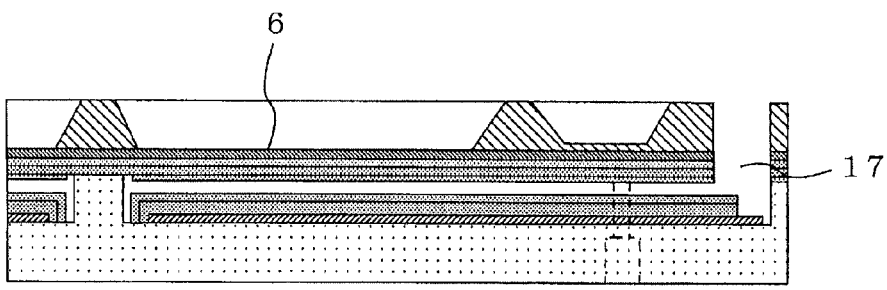
Figure 42G:
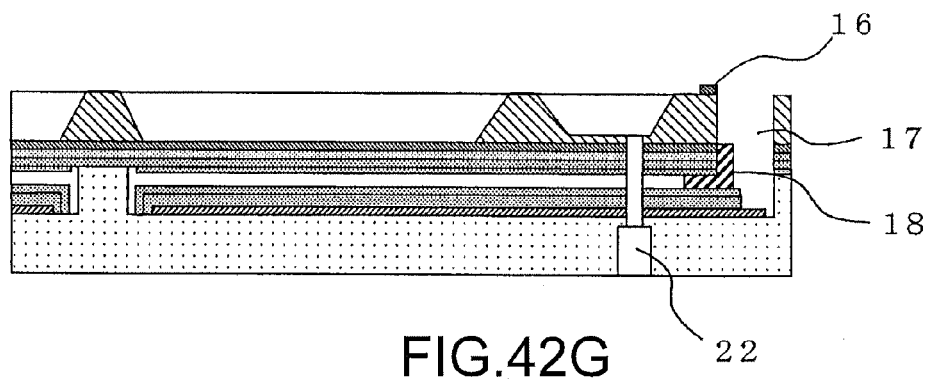
Figure 42H:
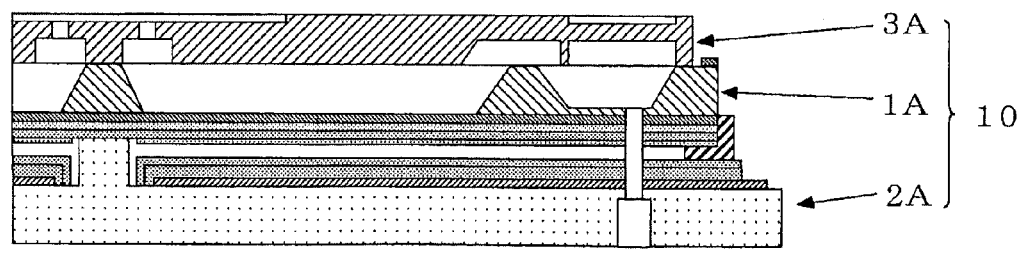

Next, a method of manufacturing the ink jet head will be described, referring to FIGS. 39 to 42. FIG. 39 is a flow chart showing brief processes for manufacturing the inkjet head 10. FIG. 40 shows a sectional view showing brief processes for manufacturing an electrode glass substrate. FIGS. 41 and 42 show sectional views showing brief processes for manufacturing the inkjet head 10.

In FIG. 39, steps S1 to S4 are processes for manufacturing electrode glass substrate and steps S5 to S9 are processes for manufacturing silicon substrate, which will be a cavity substrate. Here, processes for manufacturing the ink jet head 10 according to the seventh embodiment will be mainly explained. But, other processes for other embodiments such as first to sixth, or eighth to twelfth will be explained if the are necessary.

An electrode glass substrate 2A showing a wafer like is manufactured as the following. First, a concave portion 21 having a desired depth is formed on a glass substrate 200 with the thickness 1 mm made of bolosilicate glass by etching the glass with gold or chromium as a mask and using fluorinated acid. Here, the concave portion 21 has a grooved shape which is larger than that of the individual electrode 5 and each of a plurality of them is formed for every electrode. Then, the ITO film is deposited with the thickness 10 nm by sputtering and patterned by photolithography to remove it in area except the area for the individual electrode 5. Namely, the individual electrode 5 is formed within the concave portion 21 (S1 in FIG. 39 and (a) in FIG. 40.)

Next, the $SiO_2$ film 7b is formed with the thickness 20 nm as an insulating film at the side of the individual electrode 5 on an entire bonding surface of the glass substrate 200 by RF-chemical vapor deposition (CVD) method in which tetra-ethoxysilane (TEOS) is used as a material gas ($S_2$ in FIG. 39.) Next, the DLC film is formed with the thickness 10 nm as the surface protecting film on the $SiO_2$ film 7b by a plane parallel RF-CVD method, in which a toluene is used as a material gas (S3 in FIG. 39 and (b) in FIG. 40.)

Next, the film is patterned in an area except the area of the individual electrode 5 on the glass substrate 200 opposing the oscillating electrode 5 and such film deposited in such area is removed by $O_2$ ashing. After removing the DLC film, the $SiO_2$ film 7b deposited on the above area is removed y dry reactive ion etching (RIE) with $CHF_3$. After that, hole portions 22a to be ink supply holes 22 are formed by blast processing.

Accordingly, the electrode glass substrate 2A for the seventh embodiment is formed by the above processes.

Here, any of the above manufacturing processes may be removed or other processes may be added for the other embodiments. For example, only the step S1 in FIG. 39 is performed for the embodiments 1, 5 and 9, and a process of forming the DLC film (S3 in FIG. 39) is removed for the embodiment 11. Only steps S1 and S2 are performed for the embodiment 3. Further, the $Hf_xAl_yO_z$ film 7a is formed on the ITO film for the embodiments 2.4, 8, 20 and 12. The details of it will be explained later when it is deposited on a silicon substrate. Here, the $Hf_xAl_yO_z$ film 7a deposited on the ITO film is removed in an area except an area of the individual electrode 5 opposing the oscillating plate 6 by dry RIE with $CH_3$.

A wafer-like cavity substrate 1A is formed after bonding the wafer-like electrode glass substrate 2A to the silicon substrate 100 with anodization.

First, a boron diffused layer 101 with the thickness 0.8 μm is formed on an entire one surface a silicon substrate 100 with the thickness 280 μm (S5 in FIG. 39.) Next, the $Hf_xAl_yO_z$ film 7a is formed with the thickness 60 nm on the entire surface of the boron diffused layer 101 of the silicon substrate 100 by the ALD method with a thermal CVD device (S6 in FIG. 39.) Namely, the silicon substrate 100 is installed in the thermal CVD device and it is heated with 250 to 400° C. and vacuumed. Next, TEMAH (Tetrakis(N-ethyl methyl amino) halfnium) is introduced as a material gas for predetermined hours, then excess gas is removed by a purge. Further, $O_3$ is introduced for predetermined hours. Next, TMA (trimethyl aluminum) is introduced as a material gas for predetermined hours, then excess gas is removed by a purge. Further, $O_3$ is introduced for predetermined hours. This process cycle is repeated several times to form the $Hf_xAl_yO_z$ film 7a.

The following conditions were applied to the experiment.

Process Condition

Temperature: 300° C., Amount of supplied TEMAH: 0.1 (g/min.), Amount of supplied $O_3$: 200 (g/$Nm_3$), Amount of supplied TMA: 100 (cc/min.)

Cycle for Forming a Film

TEMAH was supplied for 200 sec. and purged. Then, $O_3$ was supplied for 400 sec. These supplies were repeated five times. Next, TMA is supplied for 10 sec. and purged. Then, $O_3$ is supplied for 30 sec. These supplies were repeated five times. If the above forming film process was one cycle, 30 cycles were repeated to form the film with the total thickness 60 nm.

Next, the $SiO_2$ film 7b is formed with the thickness 20 nm as an insulating film on the entire surface of the $Hf_xAl_yO_z$ film 7a by a RF-chemical vapor deposition method in which TEOS is used as a material gas (S7 in FIG. 39.) Next, the DLC film is formed with the thickness 10 nm as the surface protecting film 8 on the SiO₂ film 7b by a plane parallel RF-CVD method, in which a toluene is used as a material gas (S8 in FIG. 39 and (a) in FIG. 41.) Next, the DLC film is removed in an area except the area of the oscillating electrode 6 on the glass substrate 100 opposing the individual electrode 5 and by O₂ ashing (S9 in FIG. 39 and (b) in FIG. 41.).

Accordingly, the silicon substrate 100 before bonding for the seventh embodiment is formed by the above processes. This process is similarly applied to the ninth and eleventh embodiments.

The above processes are applied to other embodiments. For example, in the case of the first and third embodiments, processes S5 to S9 in FIG. 39 are performed and in the case of second, sixth and tenth, only the process S5 is performed. Further, in the case of the fourth embodiment, after performing the process S5 in FIG. 39, the SiO₂ film is formed on the entire surface of the boron diffused layer by a plasma CVD method. In the case of the fifth embodiment, after performing processes S5 to S7, the process of forming the DLC film is omitted. In the case of the eighth embodiment, after performing the process S5, the process of forming the $Hf_xAl_yO_z$ film is omitted and processes S8 to S9 are directly performed. In the case of the twelfth embodiment, after performing the process S5 in FIG. 39, the process of forming the $Hf_xAl_yO_z$ film is omitted and only the process S7 is performed.

The silicon substrate 100 before bonding for other embodiments such as first to sixth, eighth, tenth and twelfth is formed by the above processes.

Next, the silicon substrate 100 formed by the above processes are aligned on the electrode glass substrate 2A and bonded to it by anodization (S10 in FIG. 30 and (c) in FIG. 41.)

Further, the surface of the bonded silicon substrate 100 is polished so that the thickness becomes 50 μm (S11 in FIG. 39 and (d) in FIG. 41), then the polished trace is removed by wet and light etching the entire surface of the silicon substrate 100 (S12 in FIG. 39.)

Next, a photo resist deposited on the surface of the thinned and bonded silicon substrate 100 is patterned by photo lithography (S13 in FIG. 39) and an ink flow channel is formed by wet etching or dry etching (S14 in FIG. 39.) The concave portion 13 to be the discharging chamber 12, the concave portion 15 to be the reservoir 14 and the concave portion 19 to be the electrode pullout portion 17 are formed thereby ((e) in FIG. 42.) In such case, etching is stopped at the surface of the boron-diffused surface 101, forming the thickness of the oscillating plate 6 with high precision and avoiding surface roughness.

The bottom area of the concave portion 19 is removed by inductively coupled plasma (ICP) dry etching to open the electrode pullout portion 17 ((f) in FIG. 42), and then water attached the inside of the electrostatic actuator is removed (S15 in FIG. 39.) Water is removed in a vacuumed atmosphere after the silicon substrate being installed in the vacuum chamber and nitrogen gas being introduced into the chamber. Then, a sealing member 18 such as epoxy resin coated at the opened end portion of the gap to air-tightly seal it under a nitrogen atmosphere after predetermined time elapsed (S16 in FIG. 39 and (g) in FIG. 42.) This air tightly sealing after removing water attached the inside of the electrostatic actuator (the inside of the gap) improves the durability of driving the electrostatic actuator.

The bottom portion of the reservoir is penetrated through by micro-blast processing and the like so that the ink supply holes 22 are formed. Further, in order to avoid corrosion of the ink flow channel, an ink protection film made of TEOS-SiO₂ (not shown in the figure) is formed on the surface of the silicon substrate by a plasma CVD method. Further, a common electrode 16 made of metal is formed on the silicon substrate (S16 in FIG. 39 and (g) in FIG. 42.)

These processes form the cavity substrate 1A made from the silicon substrate 100 bonded to the electrode glass substrate 2A.

Then, a nozzle substrate 3A in which nozzle holes 11 are formed in advance is bonded to the surface of the cavity substrate 1A (S17 in FIG. 39 and (h) in FIG. 42.) Finally, the substrate is cut into each head chip by dicing, completing the main body of the ink jet head 10 (S18 in FIG. 39.)

As described above, the method of manufacturing the inkjet head 10 realizes the head provided with an electrostatic actuator showing an improved generation pressure, a superior dielectric breakdown voltage, superior driving durability and high discharging capability.

Further, this method manufactures the cavity substrate 1A from the silicon substrate 100, which is bonded to the electrode glass substrate 2A formed in advance, attaining the state in which the electrode glass substrate 1A holds the cavity substrate 1A. This state attains easy handling of the cavity substrate 1A without any crack even if the substrate is thinned. Accordingly, the yield of the head is improved compared to a case when only the cavity substrate is manufactured alone.

These above embodiments are not limited to the above description regarding an electrostatic actuator, an ink jet head and manufacturing thereof, but can be modified within the range of the concept of the invention. For example, an electrostatic actuator of the invention can be applied to an optical switch, a mirror device, a micro pump and a driving portion for a laser-operated mirror in a laser printer. Further, changing a liquid material discharged from nuzzle holes can realize droplet discharging devices which are used for various applications such as manufacturing ink jet printers, color filters of liquid crystal displays, forming illumination portions of organic EL displays and manufacturing micro arrays for bio molecular solutions used in a gene test.

Figure 43:
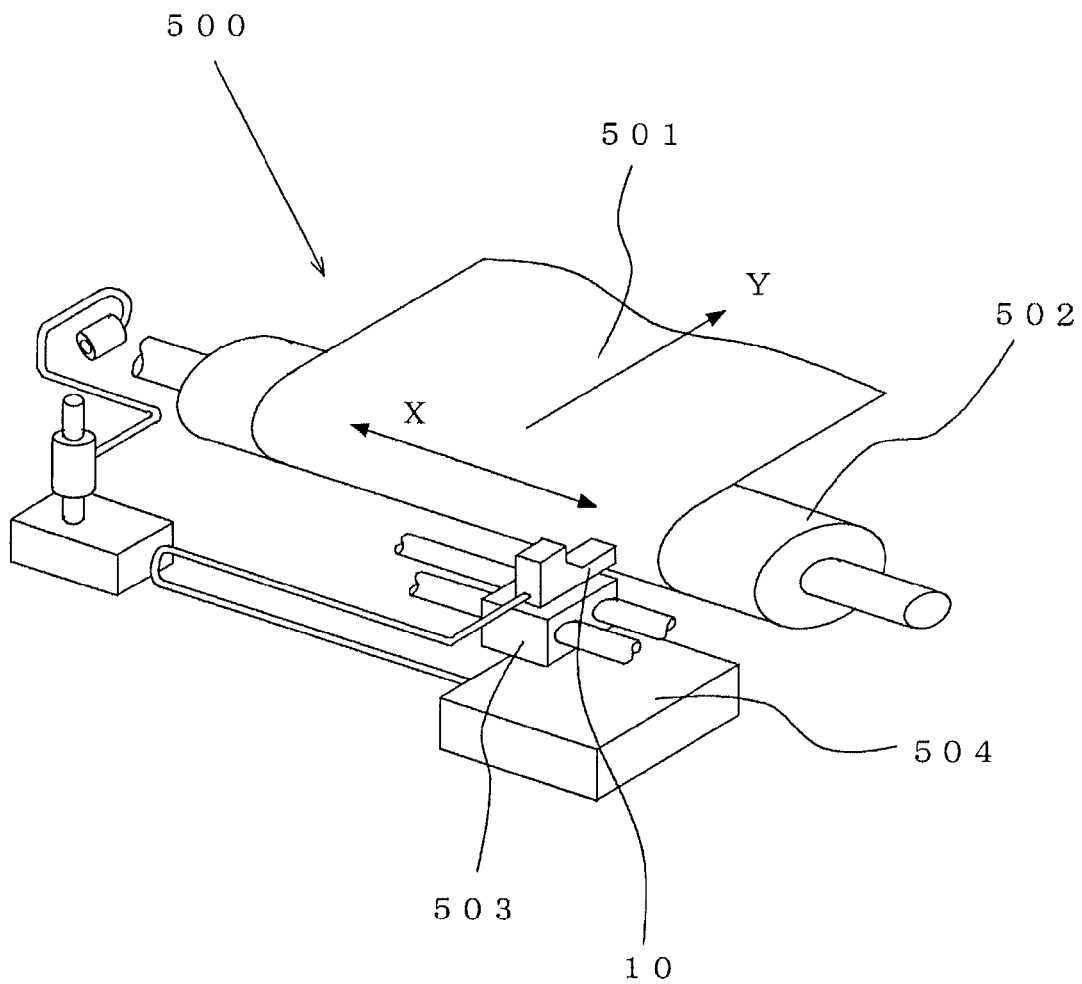
FIG. 43 is a perspective exploded view showing an inkjet printer provided with an inkjet head of the invention.

For example, FIG. 43 is a schematic view of an inkjet printer provided with the inkjet head of the invention.

The inkjet printer 500 comprises a platen 502 carrying a recording paper to the sub scanning direction Y, the inkjet head 10 of which ink nozzles faces the platen 502, a carriage 503 reciprocating the inkjet head 10 toward the main scanning direction x and an ink tank 504 supplying ink to each ink nozzle of the inkjet head 10. Hence, this inkjet printer can attain high resolution and high speed driving.

What is claimed is:

1. An electrostatic actuator comprising:
   a fixed electrode formed on a substrate;
   a movable electrode placed at an position opposing the fixed electrode via a predetermined gap;
   a driving unit giving the movable electrode a displacement by generating an electrostatic force between the fixed electrode and the movable electrode; and
   an insulation film including Hf, Al, and O formed on an opposing surface of the movable electrode, wherein an amount of the Hf in the insulation film is greater than an amount of the Al in the insulation film.

2. The electrostatic actuator according to claim 1, wherein a SiO₂ insulating film is formed on at least one of the fixed electrode and the movable electrode.

3. The electrostatic actuator according to claim 1, wherein a surface protecting film made of a carbon material such as diamond or diamond like carbon is formed on the insulating film.

4. A droplet discharging head comprising:

the electrostatic actuator according to claim 1;

a nozzle substrate having a single or a plurality of nozzle holes discharging droplets; and a cavity substrate having a concave portion as a discharging chamber communicated to each of nozzle holes formed at the side of the nozzle substrate;

wherein the substrate including the fixed electrode is placed at a position opposing an oscillating plate that includes the movable electrode formed proximate a bottom of the discharging chamber via the predetermined gap.

5. The electrostatic actuator according to claim 3, wherein the insulating film under the surface protecting film is made of $SiO_2$.

6. A droplet discharging device provided with the droplet discharging head according to claim 4.

* * * * *